(12) United States Patent  (10) Patent No.: US 7,642,569 B2
Greenberg et al.  (45) Date of Patent: Jan. 5, 2010

(54) TRANSISTOR STRUCTURE WITH MINIMIZED PARASITICS AND METHOD OF FABRICATING THE SAME

(75) Inventors: David R. Greenberg, White Plains, NY (US); Shwu-Jen Jeng, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/366,425

(22) Filed: Feb. 5, 2009

(65) Prior Publication Data

US 2009/0134429 A1  May 28, 2009

Related U.S. Application Data

(62) Division of application No. 11/764,388, filed on Jun. 18, 2007, now Pat. No. 7,491,617, which is a division of application No. 11/481,070, filed on Jul. 5, 2006, now Pat. No. 7,253,070, which is a division of application No. 10/789,282, filed on Feb. 27, 2004, now Pat. No. 7,075,126.

(51) Int. Cl.
*H01L 29/737* (2006.01)

(52) U.S. Cl. .................. 257/198; 257/197; 257/557; 257/565; 257/E29.174; 257/E29.188

(58) Field of Classification Search .......... 257/197, 257/198, 557, 565, E29.174, E9.188
See application file for complete search history.

(56) References Cited

U.S. PATENT DOCUMENTS

| | | | |
|---|---|---|---|
| 5,619,359 A | 4/1997 | Redmond et al. |
| 5,962,880 A | 10/1999 | Oda et al. |
| 6,346,453 B1 | 1/2002 | Kovacic et al. |
| 6,753,234 B1 | 6/2004 | Naem |
| 6,915,049 B2 | 7/2005 | Murata |
| 2001/0002061 A1 | 5/2001 | Scott |
| 2001/0031117 A1 | 10/2001 | Steinberg |
| 2001/0036344 A1 | 11/2001 | Steinberg et al. |
| 2003/0057458 A1 | 3/2003 | Freeman et al. |

FOREIGN PATENT DOCUMENTS

| | | |
|---|---|---|
| JP | 02-237076 | 9/1990 |
| JP | 2256242 A | 10/1990 |
| JP | 07-130759 | 5/1995 |
| JP | 07-254611 | 10/1995 |

(Continued)

*Primary Examiner*—Asok K Sarkar
(74) *Attorney, Agent, or Firm*—Scully, Scott, Murphy & Presser, P.C.; Todd M. C. Li, Esq.

(57) ABSTRACT

A transistor having minimized parasitics is provided including an emitter having a recessed extrinsic emitter portion atop an intrinsic emitter portion; a base including an intrinsic base portion in electrical contact with the intrinsic emitter portion and an extrinsic base portion in electrical contact with the intrinsic base portion and electrically isolated from the recessed extrinsic emitter portion by a set of emitter/base spacers; and a collector in electrical contact with the intrinsic base portion. The transistor may further include extrinsic base having top surfaces entirely silicided to the emitter/base spacer. Additionally, the transistor may include a base window opening within the transistor's active area. Methods of forming the above-described transistor are also provided.

4 Claims, 12 Drawing Sheets

FOREIGN PATENT DOCUMENTS

| | | |
|---|---|---|
| JP | 08-293481 | 11/1996 |
| JP | PUPA10261647 | 9/1998 |
| JP | 11330088 A | 11/1999 |
| JP | PUPA11307540 | 11/1999 |
| JP | 11-354537 | 12/1999 |
| JP | PUPA2002334889 | 11/2002 |
| JP | 2004-014656 | 1/2004 |
| WO | WO0250880 | 6/2002 |

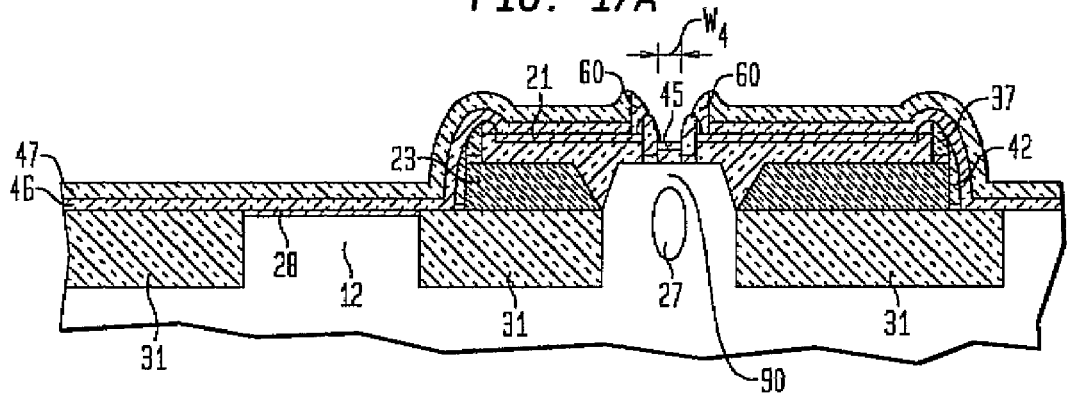
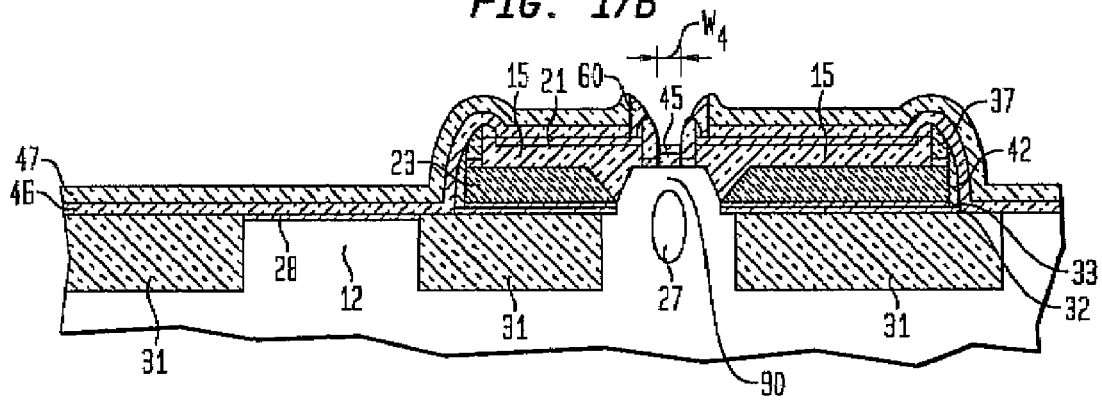
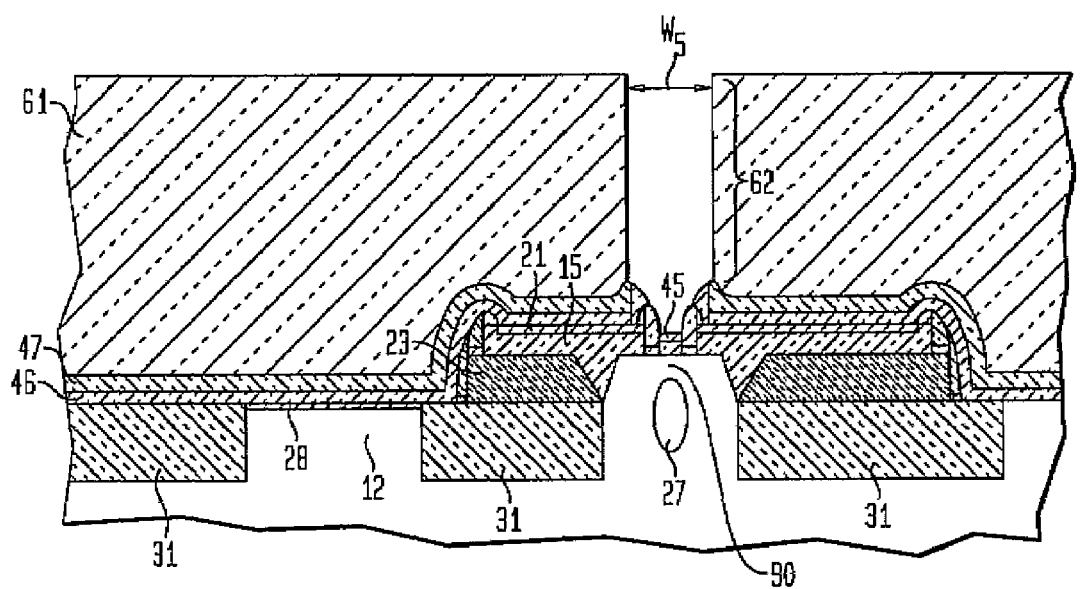

TRANSISTOR STRUCTURE WITH MINIMIZED PARASITICS AND METHOD OF FABRICATING THE SAME

CROSS REFERENCE TO RELATED APPLICATIONS

This application is a divisional of U.S. application Ser. No. 11/764,388, filed Jun. 18, 2007, now U.S. Pat. No. 7,491,617 which is a divisional of U.S. Ser. No. 11/481,070, filed Jul. 5, 2006, now U.S. Pat. No. 7,253,070, which is a divisional of U.S. Ser. No. 10/789,282 filed Feb. 27, 2004, now U.S. Pat. No. 7,075,126, issued Jul. 11, 2006. This application relates to commonly owned, co-pending published U.S. Pat. No. 6,927,476 issued Aug. 9, 2005, the whole contents and subject matter of which is incorporated by reference as if fully set forth herein.

FIELD OF THE INVENTION

The present invention relates to bipolar transistors (BJT), and more particularly to a BJT structure and method of fabricating the same that exhibits less detrimental parasitic effects and improved performance.

BACKGROUND OF THE INVENTION

Electrically, bipolar transistors can be thought of as two diodes back to back. The current flows from the emitter region through the base into the collector. When there is no current to the base, the transistor is turned off. When it is on, the current flows. It only takes a small current to turn the base on enough to allow current flow through the entire transistor.

Most bipolar circuits are designed with NPN transistors. NPN represents the respective conductivity types of the emitter, base, and collector. Bipolar transistors feature fast switching speeds. The speed and performance of a bipolar transistor is governed by a number of factors, including vertical base dopant film thickness (base width), the base resistance (Rb), and the collector-base capacitance (Ccb). Cut-off frequency ($f_T$) and maximum oscillation frequency ($f_{max}$) are the most representative measures of operation speed for high-speed transistors. Hence, the design and optimization efforts for high-speed transistors are mostly directed towards maximization of the aforementioned parameters.

The cut-off frequency ($f_T$), a measure of current gain within the device, can be improved through vertically scaling the device, by decreasing the dimension from the emitter through the base to the collector. The cut-off frequency ($f_T$), may also be increased by running the device at higher currents. One way to run a higher current is by laterally scaling the device, where the emitter has a smaller lateral dimension. Lateral scaling provides a high current density without having to increase the absolute current through the device; therefore, allowing for operating the device at an even higher cut off frequency ($f_T$). Additionally, the cut-off frequency ($f_T$) may also be increased by increasing the amount of dopant in the collector in order to offset the Kirk effect.

The above modifications, which may increase the cut off frequency ($f_T$), may also increase parasitic effects within the device, disadvantageously effecting the maximum oscillation frequency ($f_{max}$). The maximum oscillation frequency f also referred to as the power gain unity cut off frequency, is a measurement of power gain as opposed to cut off frequency ($f_T$), which is a measurement of current gain. The terms "parasitic elements of the device" are defined as the difference between an ideal NPN device and any additional values produced in providing a practical implementation of the ideal device. The parasitic effects of the device may include the parasitic portions of base resistance (Rb), collector resistance (Rc), collector-emitter capacitance (Cce), collector-base capacitance (Ccb), and collector-substrate capacitance (Ccs). In addition to the above parasitics, the parasitic elements of the emitter-base capacitance (Ceb) and the emitter resistance (Re) may also disadvantageously affect the cut off frequency ($f_T$) and maximum oscillation frequency ($f_{max}$), particularly at low current.

Currently, in NPN devices, one or more parasitic elements could be reduced by existing production means but disadvantageously at the expense of other increased parasitic effects resulting in a decreased performance device overall. For example, referring to the prior NPN BJT (bipolar junction transistor) structure depicted in FIG. 1, a reduction in the parasitic base resistance for a given emitter region size may involve forming the extrinsic base 15 in close proximity to an intrinsic portion 16 of the device by reducing the width of the spacer 14. The terms "intrinsic portion of the device" are meant to denote the portions of the device forming the NP and PN junctions of the NPN bipolar transistor, for example, which include the intrinsic emitter, intrinsic base, and intrinsic collector. Extrinsic portions of the device provide electrical communication to the intrinsic portions of the device. With close proximity of the extrinsic base 15 to the intrinsic base, the base resistance (Rb) may be reduced. But bringing the extrinsic base 15 in close proximity to the intrinsic portion 16 of the device increases the parasitic collector-base capacitance (Ccb), which is produced by the interaction between the highly doped extrinsic base 15 and the collector pedestal region 17. The parasitic collector-base capacitance (Ccb) may be minimized by reducing the dopant in the portion of extrinsic base 15 that is in closest proximity to the collector pedestal 17, but reducing the dopant in the extrinsic base region 15 disadvantageously increases the parasitic base resistance (Rb). Therefore, a trade-off exists between the parasitic elements of the collector-base capacitance (Ccb) and the base resistance (Rb).

Still referring to the prior art transistor structure depicted in FIG. 1, a parasitic emitter-base capacitance (Ceb) is disadvantageously present between the contact pad portion 19 of the emitter 18 and the extrinsic base 15. The contact pad 19 is a portion of the emitter, which extends above and overlies a portion of the extrinsic base regions 15 upper surface. In prior transistors, the contact pad portion 19 was necessary to ensure electrical contact to the emitter 18. The contact pad 19 also disadvantageously contributes to the parasitic emitter resistance (Re) by increasing the extrinsic portion of the emitter 18 without simultaneously creating an electrical short to the extrinsic base 15, particularly in the case of contact misalignment during processing. Additionally, the contact pad portion 19 of the emitter 18 increases the parasitic base resistance (Rb) by extending atop a portion of the extrinsic base 15 resulting in a highly resistive region 22 of the extrinsic base 15, which can not be silicided.

U.S. patent Application No. 2003/0057458 provides one prior NPN transistor having a shallow junction raised extrinsic base, where increasing the distance between the collector pedestal and the extrinsic base reduces the collector-base capacitance (Ccb), but disadvantageously tends to increase the parasitic base resistance (Rb). Additionally, the emitter contains an emitter contact pad overlying a portion of the extrinsic base.

U.S. Pat. No. 6,346,453 provides another transistor having an emitter including an emitter contact pad portion that disadvantageously produces increased parasitic emitter-base capacitance (Ceb) and increased emitter resistance (Re). Additionally, a portion of the contact pad region of the emitter disclosed in U.S. Pat. No. 6,346,453 is positioned overlying the extrinsic base, where a non-silicided portion of the extrinsic base Her increases the parasitic base resistance (Rb).

U.S. Pat. No. 5,962,880 provides another example of a prior transistor having a large emitter structure and further incorporating a large isolation spacer between the emitter and the base, therefore producing a device where the parasitic portions of the base resistance (Rb), emitter-base capacitance (Ceb), and the emitter resistance (Rb) can not be reduced.

In view of tie drawbacks mentioned with prior art bipolar transistors, there is a need for developing a new and improved bipolar transistor in which the parasitic effects (resistances and capacitances) of the structure may be concurrently reduced in order to improve the transistor's high-speed performance.

SUMMARY OF THE INVENTION

One object of the present invention is to provide a high performance bipolar transistor having reduced parasitic effects, thereby providing an optimized cut-off frequency and the maximum oscillation frequency.

Another object of the present invention is to provide a method for forming a new NPN transistor device structure that concurrently minimizes parasitic effects such as the base resistance (Rb), collector resistance (Rc), emitter resistance (Re), emitter-base capacitance (Ceb), collector-emitter capacitance (Cce), collector-base capacitance (Ccb), and collector-substrate capacitance (Ccs).

These and other objects and advantages are achieved in the present invention by forming a bipolar transistor in which the emitter region is recessed to reduce the extrinsic portion of the emitter and to reduce the width of the base/emitter spacer. Recessing the emitter below the horizontal surfaces of the extrinsic base regions substantially reduces the parasitic emitter base capacitance (Ceb) and emitter series resistance (Re). Broadly, the inventive bipolar transistor comprises:

an emitter comprising an extrinsic emitter portion and an intrinsic emitter portion;

a base comprising an intrinsic base portion in electrical contact with the intrinsic emitter portion and an extrinsic base portion in electrical contact with the intrinsic base portion and electrically isolated from the emitter portion by emitter/base spacers, wherein the emitter is recessed below a top surface of the extrinsic base portion.

a collector in electrical contact with the intrinsic base portion.

Another aspect of the present invention is a method of producing the above transistor structure having a recessed emitter. Broadly, the inventive method comprises:

forming a collector;

forming an intrinsic base above the collector;

forming a set of extrinsic base regions separated by an emitter channel, the emitter channel exposing an upper surface of the intrinsic base: forming isolation spacers on vertical surfaces of each of the extrinsic base regions;

forming an emitter within the emitter channel, wherein the emitter is recessed below a top surface of the extrinsic base regions;

forming an isolation stack atop at least the extrinsic base regions and the emitter;

forming a dielectric layer atop tie isolation stack;

providing an emitter via through the dielectric layer and the isolation stack to expose the emitter and a portion of the extrinsic base regions; and forming contact isolation spacers within the emitter via to provide electrical isolation between the emitter and the extrinsic base regions, wherein a portion of the emitter remains exposed.

Another aspect of the present invention is a bipolar transistor comprising silicided extrinsic base regions, where the silicided region is positioned on substantially the entire horizontal surface of the extrinsic base region and abuts the emitter base isolation spacer. Siliciding the entire horizontal surface of the extrinsic base regions substantially reduces the parasitic base resistance (Rb) of the device. Broadly, the inventive bipolar transistor comprises:

an emitter;

a base comprising an intrinsic base portion in electrical contact with the emitter and an extrinsic base portion in electrical contact with the intrinsic base portion and electrically isolated from the emitter by emitter/base spacers, wherein an upper surface of the extrinsic base portion is silicided to the emitter/base spacers; and a collector in electrical contact with the intrinsic base portion.

Another aspect of the present invention is a method of producing the above transistor structure having entirely silicided extrinsic base regions. Broadly, the inventive method comprises:

forming a collector;

forming an intrinsic base above the collector;

forming extrinsic base regions separated by an emitter channel, the emitter channel exposing the upper surface of an intrinsic base;

forming emitter/base spacers on the vertical surfaces of the extrinsic base regions;

forming an emitter within the emitter channel;

forming silicide contacts on at least the extrinsic base regions and the emitter, wherein a top surface of the extrinsic base region is silicided to the emitter/base spacer;

forming an isolation stack atop at least the extrinsic base regions and the emitter;

forming a dielectric layer atop the isolation stack;

providing a via through the dielectric layer and the isolation stack to expose the emitter and a portion of the extrinsic base regions; and forming contact isolation spacers within the via to provide electrical isolation between the emitter and the extrinsic base regions, wherein a portion of the emitter remains exposed.

Another aspect of the present invention is a bipolar transistor, which minimizes the collector-base capacitance (Ccb). Specifically, the intrinsic component of the collector-base capacitance (Ccb,int) is reduced by reducing the area of the pedestal implant region 27 and the extrinsic component of the collector-base capacitance (Ccb,ext) may be reduced by reducing the length of a base contact window (BX) such that the area of the base contact window (BX) is smaller than the active area (RX) of the device. Broadly, the inventive bipolar transistor structure comprises:

an emitter;

a base comprising an intrinsic base portion in electrical contact with the emitter and an extrinsic base portion in electrical contact with an intrinsic base portion and electrically isolated from the emitter;

a collector comprising an intrinsic collector portion surrounded by an extrinsic collector, the intrinsic collector portion in electrical contact with the intrinsic base portion, wherein an active area of the bipolar transistor comprises at least the intrinsic collector portion and the intrinsic base portion; and a base window dielectric positioned between the extrinsic collector and the extrinsic base, wherein the base window dielectric extends into the active area of the bipolar transistor.

Another aspect of the present invention is a method of producing the above transistor structure having a base window dielectric layer between the extrinsic base and the collector. Broadly, the inventive method comprises:

forming a first conductivity epitaxially grown silicon-containing layer atop a second conductivity portion of a substrate;

forming at least two isolation regions in the first conductivity epitaxially grown silicon-containing layer, wherein an active area is defined between at least two isolation regions;

forming a base window dielectric layer atop the first conductivity epitaxially grown silicon-containing layer and at least two isolation regions; wherein the base window dielectric layer extends within the active area;

forming a set of first conductivity extrinsic base regions, each of the first conductivity epitaxial base region separated by an emitter channel, the emitter channel exposing a portion of the first conductivity epitaxially grown silicon containing layer;

forming a second conductivity emitter within the emitter channel, wherein the second conductivity emitter is separated from the first conductivity extrinsic base regions by emitter/base isolation spacers; and providing electrical communication to the active area of the device.

Additionally, the collector substrate capacitance (Ccs) may be reduced by using a low dielectric material as fill for the deep trench.

BRIEF DESCRIPTION OF THE DRAWINGS

FIGS. 4(a)-19(a) illustrate (through cross-sectional views) the various processing steps for producing the bipolar transistor depicted in FIG. 2.

FIGS. 4(b)-19(b) illustrate (through cross-sectional views) the various processing steps for producing the bipolar transistor depicted in FIG. 3.

DETAILED DESCRIPTION OF THE INVENTION

Figure 1:
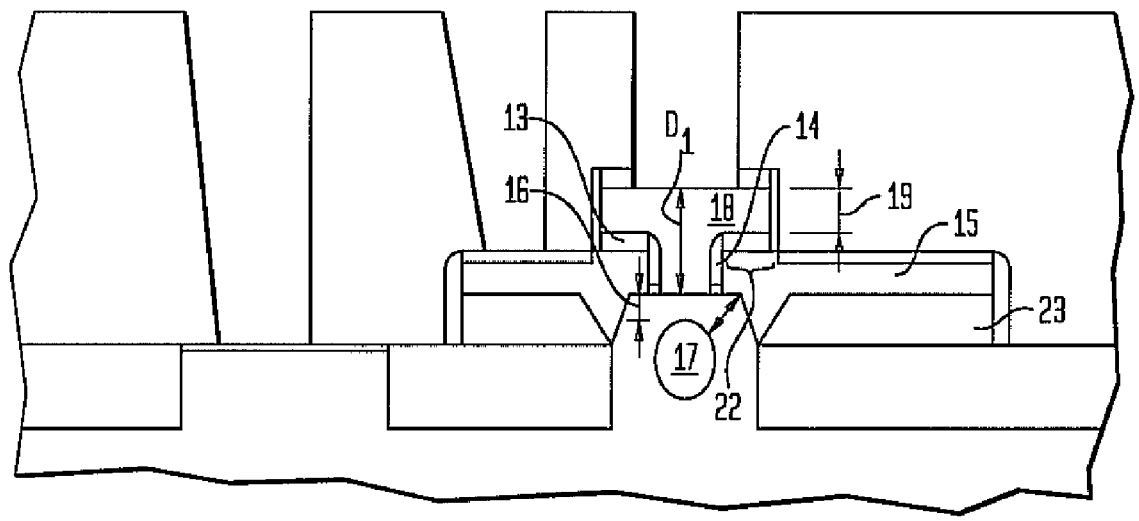
FIG. 1 is a pictorial representation (through cross-sectional view) of a prior art bipolar transistor.

The present invention directed to a bipolar transistor having improved maximum oscillation frequency (fmax), and a method of fabricating a bipolar transistor having improved maximum oscillation frequency (fmax), will now be described in greater detail by referring to the drawings that accompany the present application. For simplicity, a single bipolar device region is shown in the drawings. It is understood that other bipolar device regions as well as digital logic circuitry (not shown) may be formed adjacent to the bipolar device region depicted in the drawings. In the accompanying drawings, like and or corresponding elements are referred to by like reference numbers.

Figure 2:
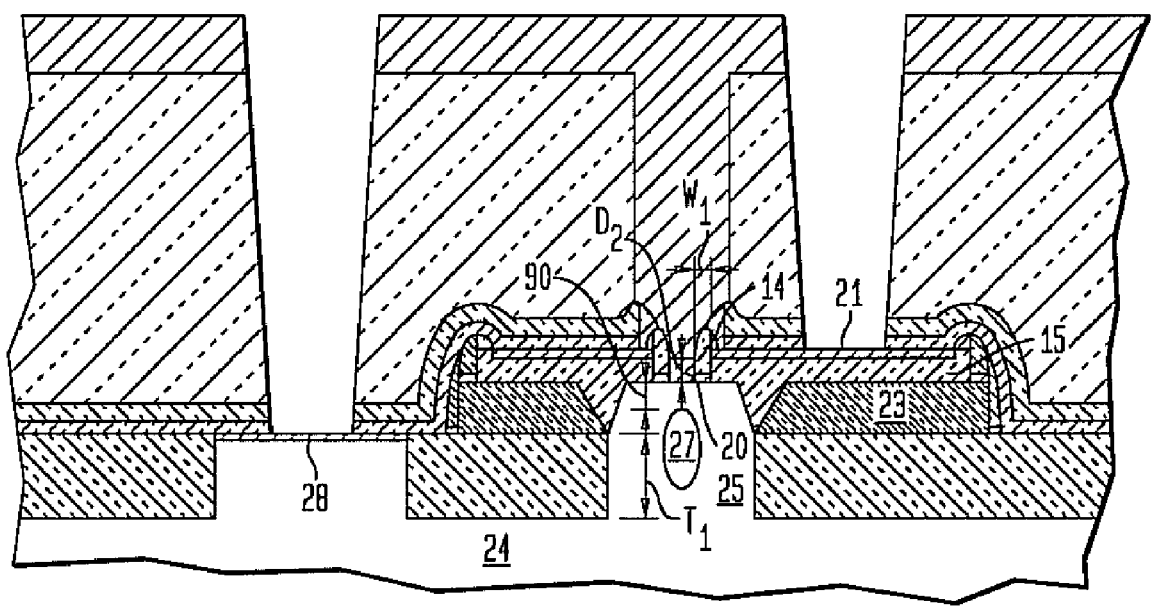
FIG. 2 illustrates (through cross-sectional view) an embodiment of the bipolar transistor of the present invention comprising a recessed emitter, narrow pedestal dopant collector region, and entirely silicided extrinsic base regions.

Referring to FIG. 2 illustrating one embodiment of the present invention, a bipolar transistor is provided having a recessed emitter 20 and optimized emitter to base spacers 14 (herein after emitter/base spacers). The recessed emitter 20 reduces the emitter resistance (Re) and the emitter-base capacitance (Ceb). The optimized emitter/base spacers 14 allow for the extrinsic base regions 15 to be positioned in closer proximity to the intrinsic portion 90 of the device than previously possible in prior bipolar transistors. The terms "intrinsic portion of the device" are meant to denote the portions of the device forming the NP and PN junctions of the NPN bipolar transistor, for example, which include the intrinsic emitter, intrinsic base, and intrinsic collector. The dopant and the SiGe profile may also be selected to provide a PNP device. Therefore, both PNP and NPN devices are within the scope of the present invention. Extrinsic portions of the device provide electrical communication to the intrinsic portions of the device. The optimized emitter/base spacers 14 reduce the base resistance (Rb) by reducing the dimension of current flow from the extrinsic base to the intrinsic base, while ensuring emitter base breakdown and leakage is minimized.

The extrinsic base 15 may be positioned closer to the intrinsic portion 90 of the device without increasing the device's overall capacitance, since the recessed emitter 20 substantially reduces the emitter-base capacitance (Ceb). Prior transistors, as depicted in FIG. 1, require an emitter 18 having a wide contact pad 19, a portion of which overlies the extrinsic base regions 15. The contact pad 19 includes a portion serving as the contact surface for subsequently formed interconnect vias, and is designed to avoid shorting the emitter 18 to the extrinsic base 15. Referring now to FIG. 2, in contrast to prior transistors, the emitter 20 of the present invention may be recessed below the top surface of the extrinsic base portions 15; therefore removing the contact pad utilized in prior transistors and reducing the emitter resistance (Re) and emitter-base capacitance (Ceb).

Still referring to FIG. 2, the emitter resistance (Re) is decreased by reducing the extrinsic portion of the emitter by reducing the distance between the top surface of the emitter 18 and the intrinsic portion of emitter. The term "in sic portion of the emitter" is meant to denote the portion of the emitter structure that directly contacts the intrinsic base, where dopant diffusing from the emitter into the base forms a NP junction. The remaining portion of the emitter, which provides electrical current to the NP junction, is the "extrinsic portion". The recessed emitter 20, depicted in FIG. 2, may have a vertical height D2 at least 50% less than the height D1 of prior transistors, as depicted in FIG. 1. Preferably, the emitter height for the recessed emitter 20 ranges from about 600' to about 1,000'.

As discussed above, recessing the emitter 20 reduces the emitter-base capacitance (Ceb). In prior transistors, as depicted in FIG. 1, parasitic capacitance is formed between the emitter 18 and the extrinsic base 15. The emitter 18 and the extrinsic base 15 function as capacitor plates, while the emitter/base isolation spacer 14 and the emitter pad contact/extrinsic base dielectric 13 function as the capacitor dielectric. In one embodiment of the present invention, the portion of the emitter-base capacitance (Ceb) formed between the contact pad 19 of the emitter and the extrinsic base 15 of prior transistors is removed by utilizing a recessed emitter 20, as depicted in FIG. 2.

Additionally, the emitter-base capacitance (Ceb) can be further reduced by recessing the emitter 20 below the vertical height of the extrinsic base regions 15; therefore reducing the length (measured in the vertical direction) of the emitter/base spacer 14 that functions as a capacitor dielectric. By reducing the portion of the emitter/base spacer 14, which functions as a capacitor dielectric, the parasitic emitter-base capacitance (Ceb) is decreased. The length of the emitter base/spacer 14 that may function as the capacitor dielectric corresponds to the height of the recessed emitter 20 and may range from about 600' to about 1,000'.

The reduction in the emitter-base capacitance (Ceb) attributed to the recessed emitter 20 allows for the extrinsic base 15 to be moved in closer proximity to the intrinsic portion 90 of the device than previously possible in prior transistors without increasing the devices overall parasitic capacitance. In one embodiment, the extrinsic base 15 may be moved in closer proximity to the intrinsic portion of the device by reducing the width W1 of the emitter/base spacer 14. Preferably, the emitter/base spacer 14 may have a width W1 on the order of approximately 300 Å, so long as emitter base leakage and emitter base breakdown does not occur. The emitter/base spacer 14 width W1 may range from about 400' to about 800'. Therefore, the distance between the edge of the extrinsic base 15 and the edge of the emitter opening 34 is on the order of about 400' to about 800'.

Although reducing the width W1 of the emitter/base spacer 14 may increase the capacitance between the emitter 20 and the extrinsic base 15, the increase in the emitter-base capacitance (Ceb) attributed to the reduction in the width W1 of the emitter/base spacer is more than compensated by the reduction in the emitter-base capacitance (Ceb) that is attributed to the recessed emitter 20. Additionally, the increase in the collector-base capacitance (Ccb), which may occur by positioning the extrinsic base 15 in closer proximity to the collector pedestal dopant region 27, is more than compensated by the reduction of the emitter-base capacitance (Ceb) attributed to the recessed emitter 20. Therefore, the base resistance (Rb) may be reduced by decreasing the distance between the extrinsic base 15 and the intrinsic portion 90 of the device (as well as the distance to the collector pedestal dopant region 27) without substantially effecting the device's overall capacitance in a manner that would reduce performance.

Still referring to FIG. 2, the parasitic base resistance (Rb) of the bipolar transistor may be further reduced by siliciding the top surface of the extrinsic base 15, where the silicide material 21 extends to the emitter/base spacer 14. The silicide layer 21 provides a low resistance current path to the intrinsic portion 90 of the device, since the resistance of the silicide material is at least an order of magnitude less than the underlying extrinsic base 15.

Referring back to FIG. 1, in prior transistors, the contact pad portion 19 of the emitter 18 extends over a portion of the extrinsic base 15, where the contact pad portion 19 blocks the underlying portion of the extrinsic base 15 from being silicided. Therefore, prior transistors have a high resistance portion 22 of the extrinsic base 15 underlying the contact pad 19 of the emitter 18 that cannot be silicided. Referring back to FIG. 2, the present invention substantially reduces the base resistance (Rb) inherent in prior transistors by siliciding the high resistance portion at the extrinsic base 15 regions of the above-described prior transistor.

Another aspect of the present invention is that a sacrificial high quality oxide may further decrease the base resistance (Rb) by improving the quality of the interface between the extrinsic base 15 and an epitaxial SiGe base layer 23. The terms "high quality oxide" are meant to denote a thermally grown oxide layer, in which the oxide gathers impurities, such as surface contaminates. By removing the high quality oxide the gathered impurities are also removed, therefore providing a pristine surface.

Another aspect of the first embodiment of the bipolar transistor structure of the invention is that the collector resistance (Rc) may be reduced without disadvantageously impacting the collector-base capacitance (Ccb). Referring to FIG. 2, the intrinsic portion 90 of the transistor may be electrically connected to a subcollector 24 through a collector pedestal dopant region 27. The subcollector 24 is a heavily doped low resistance portion of the substrate. The collector pedestal region 27 is formed in a less conductive epitaxially grown Si-containing layer 25 (also referred to as the collector) positioned atop the subcollector 24.

The collector resistance (Rc) may be reduced by increasing the dopant concentration in the subcollector 24 side of the collector pedestal dopant region 27, therefore increasing the electrical carriers to the subcollector 24. Since the increased dopant concentration is positioned closer to the subcollector 24 portion of the collector, as opposed to the intrinsic side of the collector, the collector-base capacitance (Ccb) is not substantially increased.

The collector resistance (Rc) is further reduced by the decreasing the thickness T1 of the epitaxial Si-containing layer 25, in which the collector pedestal dopant region 27 is formed. Reducing the thickness T1 of the epitaxial Si-containing layer 25 reduces the current path from the intrinsic portion 90 of the device to the collector contact 28, therefore reducing the parasitic portion of the collector resistance (Rc).

The intrinsic component of the collector-base capacitance (Ccb) may be reduced by reducing the area of the collector pedestal dopant region 27. For example, the area of the collector pedestal dopant region 27 can be reduced by providing a narrow thin collector pedestal dopant profile, as depicted in FIG. 2. Prior bipolar transistors typically include a broader collector dopant profile similar to the collector pedestal 17 depicted in FIG. 1. Although collector resistance is increased by narrowing the pedestal region 27, this increase is more than compensated by a corresponding decrease in the collector resistance (Rc) from thinning the epitaxial region 25. Therefore, reduced collector-base capacitance (Ceb) is enabled without sacrificing collector resistance (Rc).

Figure 3:
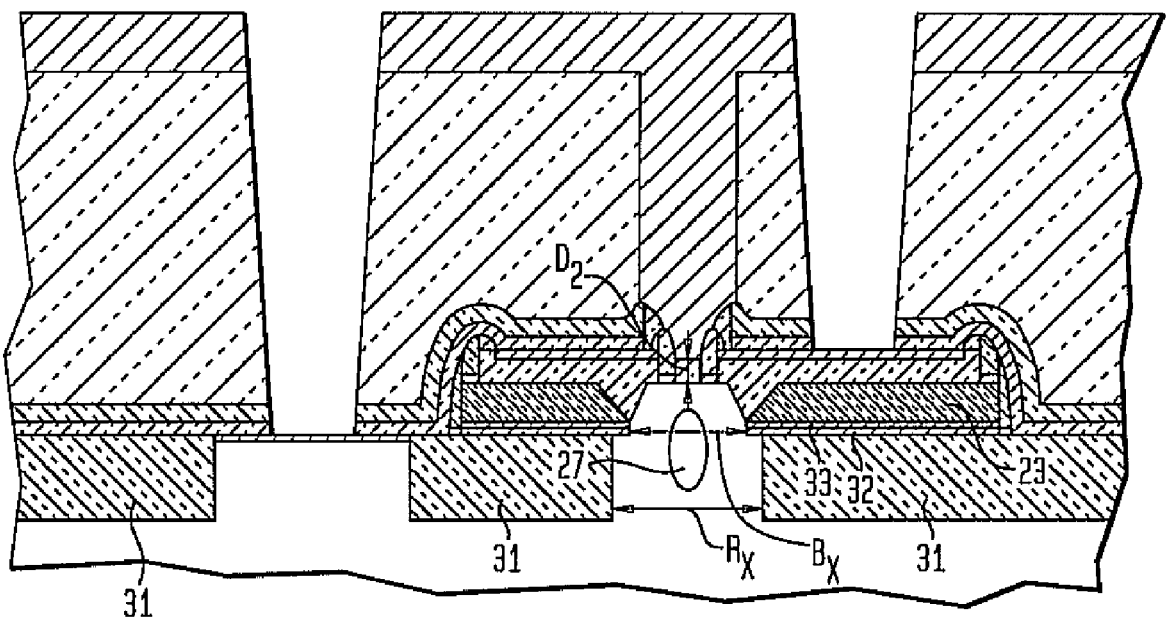
FIG. 3 illustrates (through cross-sectional view) another embodiment of the bipolar transistor of the present invention comprising a base window dielectric extending into the active area of the bipolar transistor.

Referring to FIG. 3, in another embodiment of the present invention the collector-base capacitance (Ccb) may be further reduced by introducing a dielectric layer into the active region (Rx) of the device, where the dielectric layer is positioned underlying the extrinsic base 15 and the epitaxial SiGe base layer 23. Preferably, the dielectric layer may be a base window dielectric 32, 33 that provides a base contact window (Bx). Preferably, the base window dielectric 32, 33 extends into the active area (Rx) of the device, where the base contact window (Bx) has a lesser width than the active area (Rx). The active area (Rx) includes at least the intrinsic portions 90 of the device and is positioned between the isolation regions 31.

The base window dielectric layer 32, 33 reduces the collector-base capacitance (Ccb), since the additional dielectric increases the distance separating the collector from the combination of the extrinsic base 15 and epitaxial SiGe base layer 23. The extension of the base window dielectric layer 32, 33 into the active area of the device (Rx) may be implemented with or without the recessed emitter 20. The extension of the base window dielectric layer 32, 33 into the active area of the device (Rx) may be implemented with or without the entirely silicided extrinsic base regions.

Another aspect of the present invention is that the collector-substrate capacitance (Ccs) may be reduced by incorporating a low-k dielectric material as the deep trench (not shown) dielectric fill. The trench depth may range from about 2 μm to about 8 μm, preferably being from about 4 μm to about 6 μm.

The method of manufacturing the bipolar transistor depicted in FIGS. 2 and 3 is now described in FIGS. 4-19, where FIGS. 4(a)-19(a) depict the method of forming the bipolar transistor depicted in FIG. 2 and FIGS. 4(b)-19(b) depict the method of forming the bipolar transistor depicted in FIG. 3.

Figure 4A:
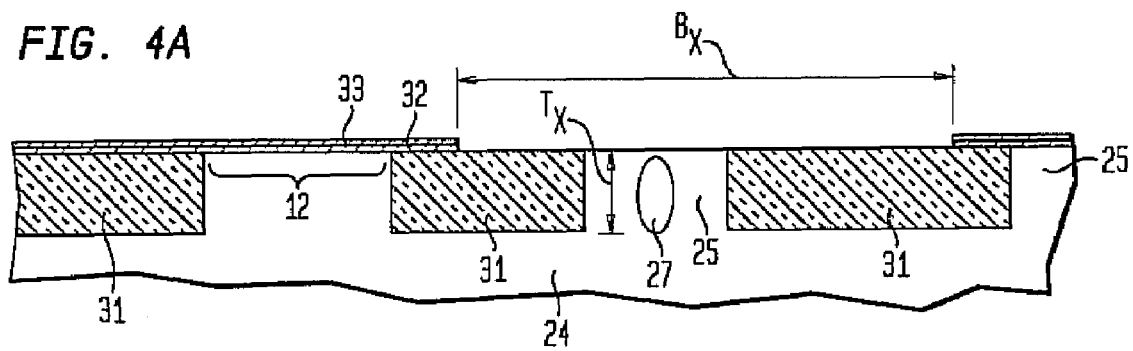

Referring first to FIG. 4(a), a Si-containing substrate is provided, in which the upper surface of the Si-containing substrate is heavily doped to produce a low resistance subcollector region 24. The terms "Si-containing" as used herein denotes any semiconducting material that includes silicon. Illustrative examples include, but are not limited to: Si, SiGe, SiGeC, SiC.

The subcollector 24 may be doped to provide an $n^+$ type silicon. Preferably, the subcollector region 24 may be doped with elements from Group V of the Periodic Table of Elements including but not limited to: arsenic (As), antinony (Sb), or phosphorus (P). The dopant concentration may be on the order of about $10^{20}$ atoms/cm$^3$ to about $10^{21}$ atoms/cm$^3$. The subcollector region 24 may be doped by conventional ion implantation processes or doped in situ. The subcollector 24 may have a variety of thicknesses, but preferably has a thickness ranging from about 0.5 µm to about 2.0 µm.

An epitaxially grown Si-containing layer 25 is then formed atop the subcollector region 24. Preferably, the epitaxially grown Si-containing layer 25 is formed using low temperature epitaxial growth processes typically performed at a temperature ranging from about 450° C. to about 700° C. Preferably, the epitaxially grown Si-containing layer 25 is not intentionally doped. Typically, the epitaxial grown Si-containing layer is auto-doped with an n-type dopant including but not limited to: arsenic (As), antimony (Sb), or phosphorus (P). The dopant concentration is preferably limited to less than $10^{15}$ atoms/cm$^3$, preferably being less than $10^{14}$ atoms/cm$^3$. To minimize the parasitic portion of the collector resistance (Rc) the thickness T1 of the epitaxially grown Si-containing layer 25 may be less than about 0.6 µm, preferably ranging from about 0.3 µm to about 0.5 µM.

The thickness of the epitaxially grown Si-containing layer 25 sets the depth of the later formed pedestal collector region 27 from the top surface of the device and more importantly the dimension from the intrinsic base to the subcollector 24 and therefore comprises a large component of the extrinsic collector region. By reducing the thickness of the epitaxially grown Si-containing layer 25 the collector resistance may be reduced.

Still referring to FIG. 4(a), isolation regions 31, i.e., shallow trench isolation (STI) regions, are then formed by conventional process steps. STI regions may be formed by etching a trench into the epitaxially grown silicon-containing layer 25 utilizing a conventional dry etching process such as reactive-ion etching (RIE) or plasma etching. The trenches may optionally be lined with a conventional liner material, e.g., an oxide, and then CVD or another like deposition process is used to fill the trench with polysilicon or another like STI dielectric material. The STI dielectric may optionally be densified after deposition. A conventional planarization process such as chemical-mechanical polishing (CMP) may optionally be used to provide a planar structure. Alternatively, the isolation regions 31 may be field isolation regions. Field isolation regions may be formed using a local oxidation of silicon process.

Following the formation of the isolation regions 31, a collector pedestal dopant region 27 may be introduced into the epitaxially grown Si-containing layer 24, where the collector pedestal dopant forms the base collector junction and conducts current to the subcollector 24. The collector doping must be sufficiently high to reduce the Kirk effect, also referred to as base push-out, during device operation. The collector pedestal dopant region 27 may be selectively implanted within the epitaxially grown silicon layer 25 between two isolation regions 31 using a block mask patterned to expose the selected area for implantation. The block mask may be formed using conventional photolithography and etch processes, where the opening in the block mask corresponds with the subsequently implanted collector pedestal dopant region 27 and has a width ranging from about 0.2 µm to about 0.8 µm.

The collector pedestal dopant region 27 may be doped to produce an $n^-$ type silicon-containing region. Preferably, the collector pedestal dopant region 27 has a width sufficiently narrow to decrease the parasitic collector-base capacitance (Ccb) and a doping concentration sufficiently high to restrict base widening during device operation and to ensure low collector resistance (Rc). The pedestal region is preferably formed using a two stage ion implantation process including a first shallow implant comprising a low energy, low concentration implant to avoid impacting the collector base capacitance (Ccb) and a second deeper implant comprising a high energy, high concentration implant to reduce the collector resistance (Rc) at the portion of the pedestal collector region 27 in closest proximity to the underlying subcollector 24.

The collector pedestal dopant region 27 is formed in the present invention using a conventional ion implantation process wherein an n-type dopant such as As or Sb is employed. In one preferred embodiment of the present invention, the shallow implant of the collector pedestal dopant region 27 is comprised of Sb. Sb is preferred since it results in the narrowest as-implanted profile as well as it diffuses much less readily than As and substantially less readily than P. The shallow implant region is formed using an ion implant dose of from about $2\times10^{11}$ atoms/cm$^2$ to about $1\times10^{13}$ atoms/cm$^2$ and an energy of from about 20 keV to about 150 keV. More preferably, the shallow implant region of the collector pedestal dopant region 27 is formed using an Sb ion dose of from about $5\times10^{11}$ atoms/cm$^2$ to about $5\times10^{12}$ atoms/cm$^2$ and an energy of from about 30 to about 50 keV.

In accordance with the present invention, the region of the pedestal collector region 27 in close proximity to the intrinsic base has a width that is less than about 0.8 µm. More preferably, the region of the pedestal collector region 27 in close proximity to the intrinsic base has a width of from about 0.1 µm to about 0.5 µm. By producing a reduced area pedestal collector region 27 the parasitic portion of the collector-base capacitance (Ccb) may be minimized.

The second deeper implant forming the collector pedestal dopant region 27 in closest proximity to the subcollector region 24 comprises an implant concentration on the order of approximately $10^{16}$ atoms/cm$^3$.

The collector pedestal dopant region 27 may be omitted. Additionally, the collector pedestal dopant region 27 may be practiced with only the deep implant, where the shallow implant may be omitted. In one embodiment, the collector base breakdown voltage may be improved by a collector dopant region solely comprising the deep implant.

A collector reach through region 12 may be formed in a portion of the epitaxially grown Si-containing layer 25 opposite the portion of the epitaxially grown Si-containing layer 25 in which the intrinsic portion 90 of the device is positioned. The collector reach through 12 provides a contact surface for the subsequently formed collector interconnect and preferably comprises a dopant type and dopant concentration similar to the subcollector region 24.

In a next process step, an etch-stop layer 32 of oxide or other like material capable of providing an etch-stop is deposited or grown across the top surface of the epitaxially grown Si-containing layer 25 and the top surface of the isolation regions 31. Preferably, the etch-stop layer 32 is silicon dioxide ($SiO_2$) having a thickness ranging from about 10 nm to about 50 nm. A seed layer 33 may be subsequently deposited atop the etch stop dielectric layer 32, although the seed layer 33 may be omitted. Preferably, the seed layer 33 may comprise polysilicon or amorphous silicon and have a thickness ranging from about 10 nm to about 100 nm.

Conventional photolithographic and etching techniques may then be employed to remove a portion of seed layer 33 and etch-stop dielectric 32. The removed portions of the seed layer 33 and etch stop-dielectric 32 provide a base window (Bx) over a portion of the epitaxially formed Si-containing layer 25 that subsequently becomes the intrinsic portion of the bipolar transistor. Additionally, the base window (Bx) may also expose a portion of the isolation regions 31. Etch stop dielectric 32 and seed layer 33 remain over the collector reach through region. The remaining etch stop dielectric 32 and seed layer 33 may be subsequently removed.

Figure 4B:
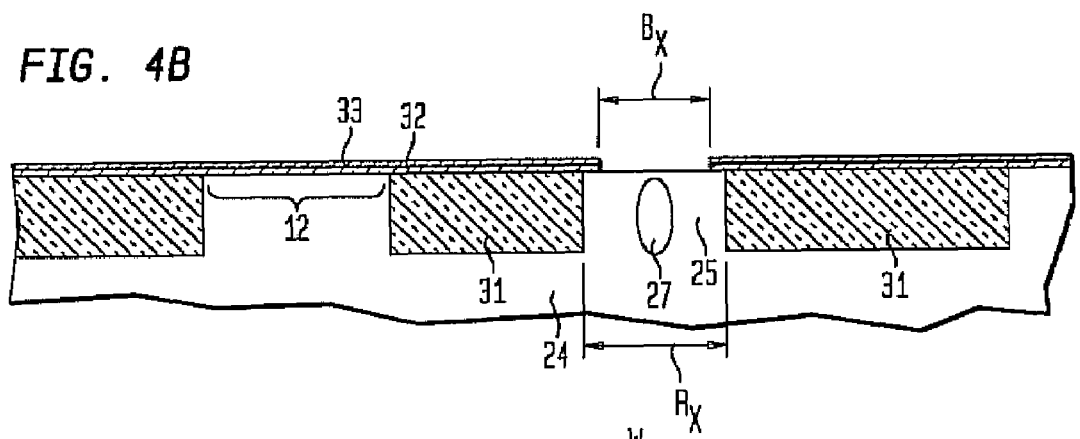

Referring to FIG. 4(a), the base window (Bx) of one embodiment of the present invention corresponding to the device such as depicted in FIG. 2 has a width ranging from approximately 0.5 µm to approximately 1 µm. Turning now to FIG. 4(b), in another embodiment of the present invention corresponding to the device of FIG. 3 the width of the base window (Bx) is less than the width of the device's active area (Rx). The active area (Rx) includes the intrinsic portion of the device and is flanked by isolation regions 31 formed as herein described with respect to FIG. 4(a). Preferably, the base window (Bx) may have a width ranging from about 0.3 µm to about 0.5 µm, where a portion of base window dielectric 32, 33, comprising the $SiO_2$ etch stop dielectric 32 and/or polysilicon seed layer 33, extends laterally beyond the isolation regions 31 into the active area (Rx) of the device. The active area (Rx) may have a width ranging from about 0.3 µm to about 0.8 µm, preferably being less than 0.6 µm.

Introducing portions of the base window dielectric 32, 33 into the device's active area (Rx), such as shown in FIG. 4(b), positions dielectric material between a portion of the extrinsic collector and the subsequently formed extrinsic base regions. By increasing the thickness of the dielectric material separating the aforementioned base and collector regions, the collector-base capacitance (Ccb) is reduced.

Figure 5A:
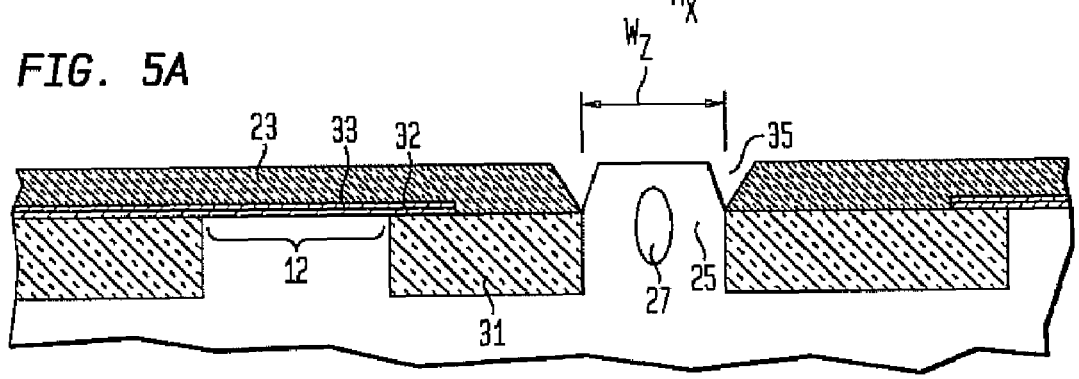

Referring to FIG. 5(a), an epitaxial silicon germanium (SiGe) layer 23 is then grown atop the upper surface of the structure depicted in FIG. 4(a). Preferably, the epitaxial silicon germanium (SiGe) layer 23 is grown using low temperature epitaxial growth processes, where the temperature may range from about 450° C. to about 700° C. Alternatively, polysilicon germanium (poly-SiGe) may be formed overlying the isolation regions 31, so long as epitaxial SiGe is formed atop the region of the epitaxially grown-silicon containing layer 25, in which the intrinsic portion of the device is formed. The epitaxially grown SiGe layer 23 may be p-type doped, where the p-type dopant may comprise an element from Group IIIA of the Periodic Table of Elements, preferably being boron (B). The low temperature SiGe epitaxial layer is doped consistent with the desired dopant concentration and species of the intrinsic base.

Due to the growth differential between forming epitaxial SiGe on the epitaxial Si-containing layer 25 and forming epitaxial SiGe on the oxide of the isolation regions 31, a divot 35 is formed in the SiGe epitaxial layer 23 overlying each interface of the epitaxially grown Si-containing layer 25 and the trench isolation region 31.

Figure 5B:
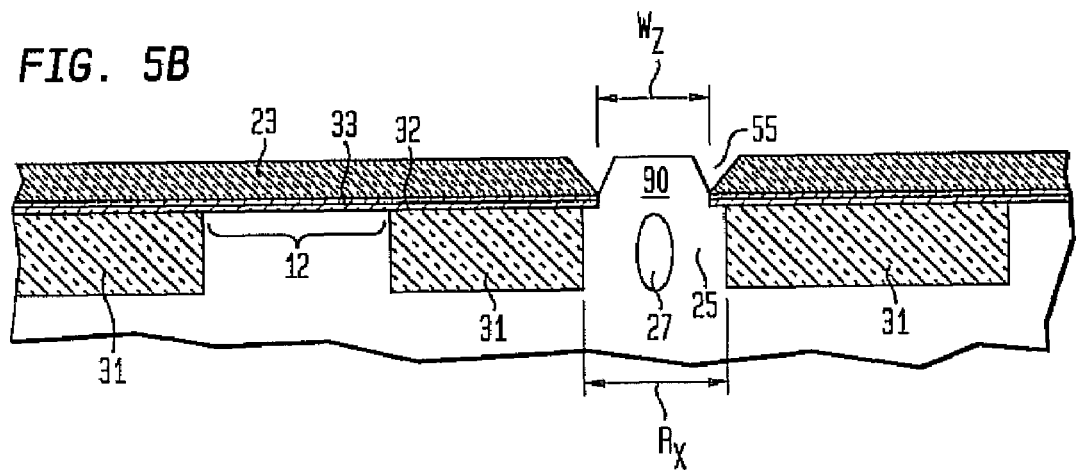

FIG. 5(b) represents this process step when the base window (Bx) has a lesser lateral dimension than the active area Rx of the device. In this embodiment, the apexes of the divot regions 35 are aligned with the end portion of the base window dielectric 32, 33. Introducing the base window dielectric material 32, 33 into the active region (Rx) of the device reduces the width W2 of the SiGe epitaxial layer 23 in which the intrinsic portion 90 of the device is formed; in comparison to the width W3 of the SiGe epitaxial layer 23 in devices where the base window (Bx) is not smaller than the active area (Rx). Reducing the base window (Bx) to be within the active area (Rx) of the device reduces the outdiffusion of dopant from of the extrinsic base 15 into the divot regions 35 and along the silicon to isolation region interface. Suppressing this diffusion reduces the extrinsic collector-base capacitance (Ccb, int).

Figure 6A:
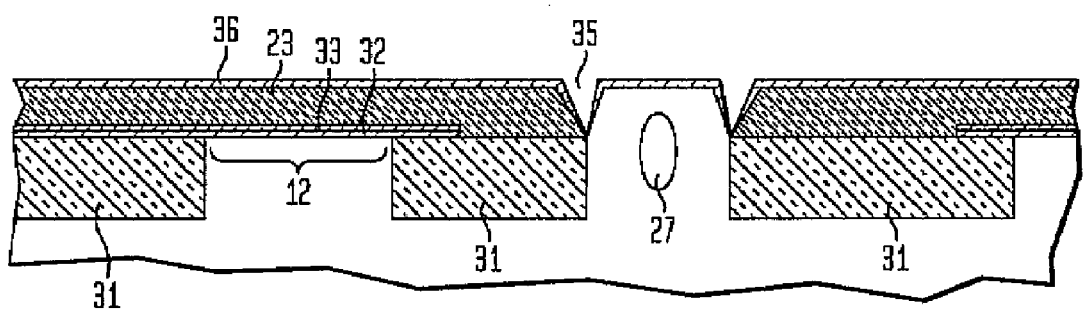
Figure 6B:
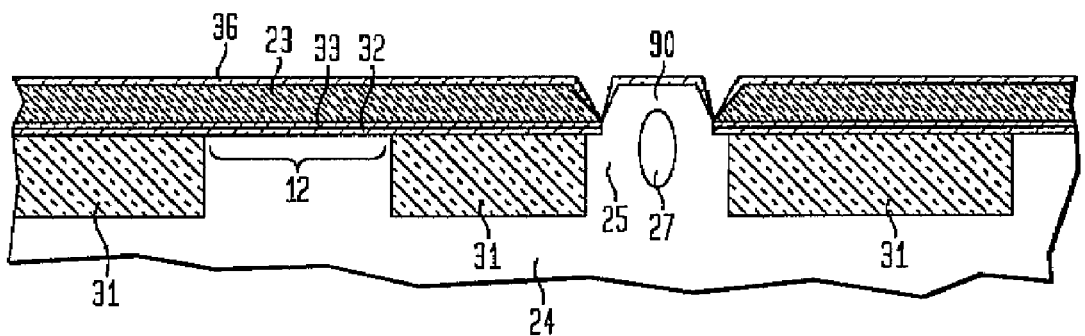

Referring to FIGS. 6(a) and 6(b), a sacrificial oxide film 36 is then deposited atop the SiGe epitaxial layer 23. Preferably, the sacrificial oxide film 36 may be formed using a high-pressure oxidation process. Alternatively, the oxide film 36 may be formed by low cycle thermal oxidation, where the temperature ranges from about 700° C. to about 740° C. Typical thickness for the oxide film 36 ranges from about 5 nm to about 20 nm. The quality of the sacrificial oxide film 36 effects the interface between the SiGe epitaxial layer 23 and the subsequently formed extrinsic base regions 15. A high quality sacrificial oxide film 36 improves the SiGe epitaxial layer/extrinsic base interface and decreases the base resistance (Rb). The high quality sacrificial oxide film 36 is a thermally grown oxide layer, which gathers impurities, such as surface contaminates. By removing the sacrificial high quality oxide film 36 the gathered impurities are also removed providing a pristine surface.

Figure 7A:
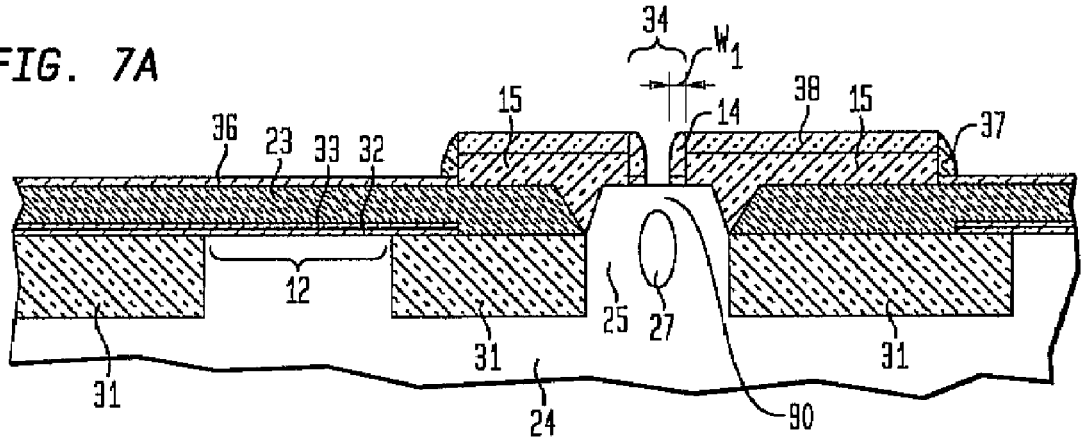

Referring to FIG. 7(a), in a next process step the extrinsic base regions 15 are formed atop the epitaxially grown SiGe layer 23. First, a portion of the sacrificial oxide film 36 is removed from the upper surface of the epitaxially grown SiGe layer 23, using conventional photolithography and etch process steps. Following the removal of the portion of the sacrificial oxide film 36, an extrinsic layer or film that will form the raised extrinsic base regions 15 is deposited upon the upper surface of the device. The extrinsic layer may be a highly-doped polysilicon or an amorphous silicon and may or may not be in-situ doped. The dopant type for the extrinsic layer may be the same conductivity type as the epitaxially grown SiGe layer. For an NPN transistor, the dopant is typically boron. Typically, the thickness of the extrinsic layer ranges from about 100 nm to about 650 nm. Following deposition, the extrinsic layer or film is then etched and planarized to form the extrinsic base regions 15. In a further processing step, an emitter channel 34 is formed and separates the extrinsic base regions 15.

Dielectric spacers 14, 37 are then formed abutting the extrinsic base 15 sidewalls. The dielectric spacers 14, 37 are formed using conventional deposition and etch process steps. The dielectric spacers 14, 37 may comprise of oxide, nitride, or oxynitride material, preferably being $Si_3N_4$. The width W1 of the dielectric spacer 14 that separates the extrinsic base 15 from the subsequently formed emitter, herein after referred to as the emitter/base spacer 14, may typically range from approximately 400' to about 800'. In one embodiment, the width W1 of the emitter/base spacer 14 may be on the order of approximately 300' or less, positioning the extrinsic base 15 in closer proximity to the intrinsic portion 90 of the device than previously capable in prior transistors, so long as emitter-base leakage and emitter-base breakdown is avoided.

Figure 7B:
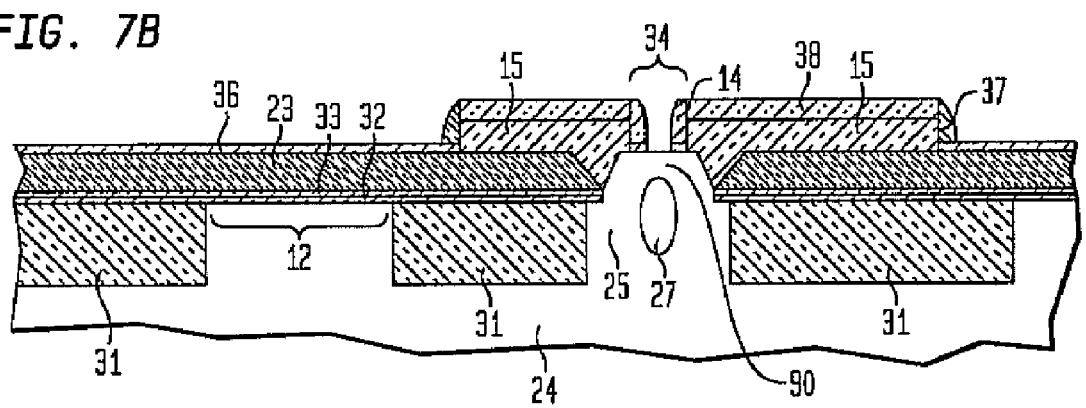

Following the formation of the dielectric spacers 14, 37 an extrinsic base isolation film 38 may be formed atop the extrinsic base 15. The extrinsic base isolation film 38 may comprise oxide, nitride, and oxynitride materials, preferably being SiO$_2$ formed from tetraethylorthosilicate (TEOS) precursors. FIG. 7(b) represents the above process steps when the base window Bx has a lesser lateral dimension than the active area Rx of the device.

Figure 8A:
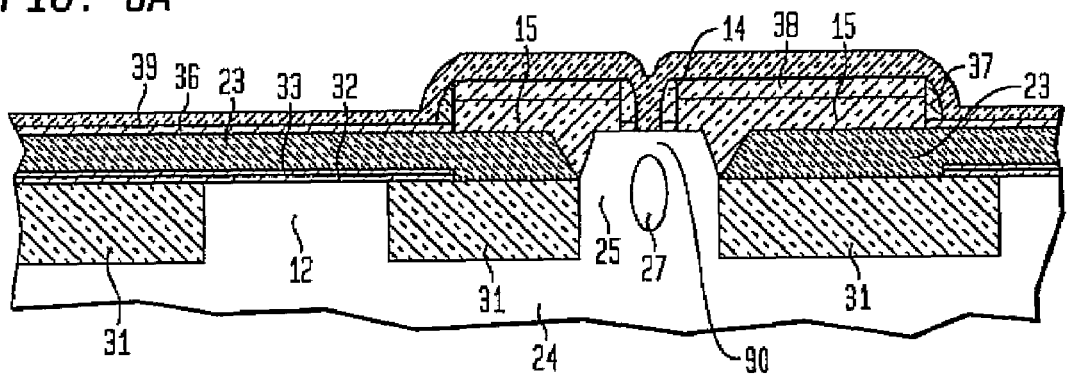
Figure 8B:
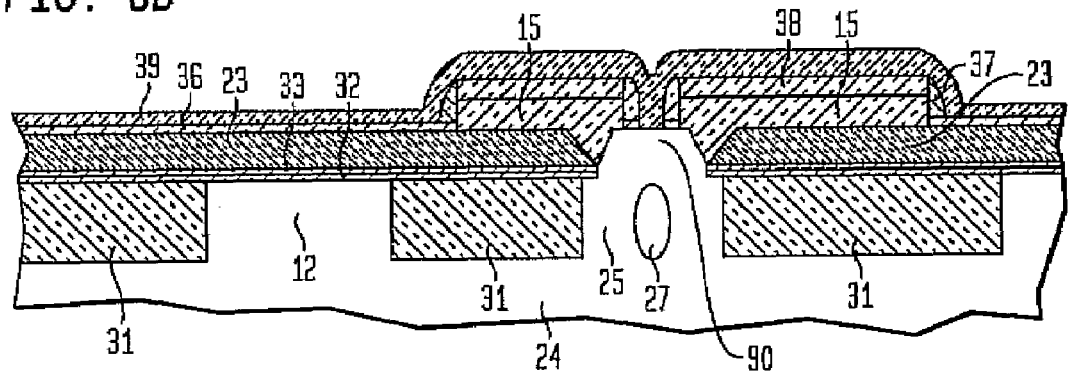

Referring to FIGS. 8(a) and 8(b), a polysilicon or amorphous silicon film 39 may then be blanket deposited upon the top surface of the device shown in FIGS. 7(a) and 7(b) respectively. The polysilicon or amorphous silicon film 39 may have a thickness ranging from about 30 nm to about 200 nm. The polysilicon or amorphous silicon film 39 may be in-situ doped or alternatively doped by ion implantation. The dopant is preferably an in-situ doped phosphorous (P), which minimizes the temperatures required to slightly diffuse the dopant into the intrinsic portion of the epitaxially formed SiGe layer 23, as opposed to arsenic (As) or antimony (Sb) that require higher temperatures. FIG. 8(b) represents this process step when the base window (Bx) has a lesser lateral dimension than the active area (Rx) of the device.

Figure 9A:
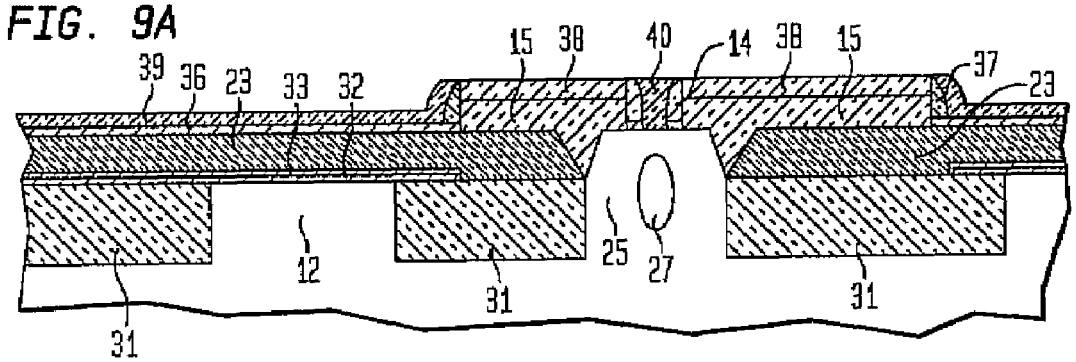
Figure 9B:
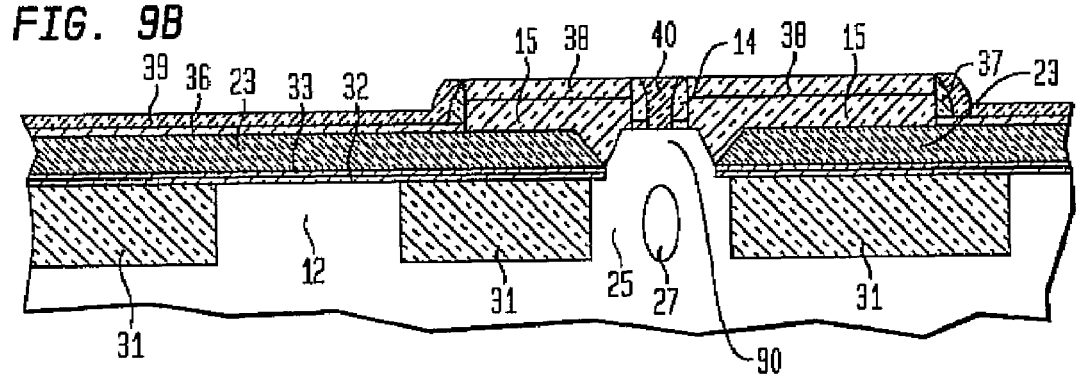

Turning now to FIG. 9(a), in a next process step the polysilicon or amorphous silicon film 39 is planarized by conventional planarization processes including, but not limited to: chemical mechanical planarization (CMP). The polysilicon or amorphous silicon layer 39 is planarized until the upper surface of the extrinsic base isolation dielectric 38 is exposed, forming an emitter plug 40 coplanar with surface of the extrinsic base isolation dielectric 38. A remaining portion of the polysilicon or amorphous silicon film 39 remains on the regions of the device flanking the raised extrinsic base regions, as depicted in FIG. 9(a). Alternatively, the polysilicon or amorphous silicon film 39 maybe planarized by reactive ion etch. FIG. 9(b) represents this process step when the base window (Bx) has a lesser lateral dimension than the active area (Rx) of the device.

Figure 10A:
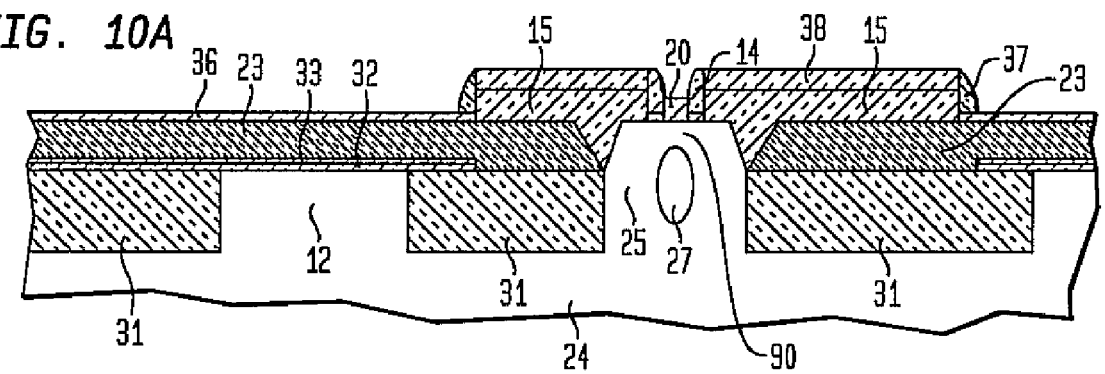
Figure 10B:
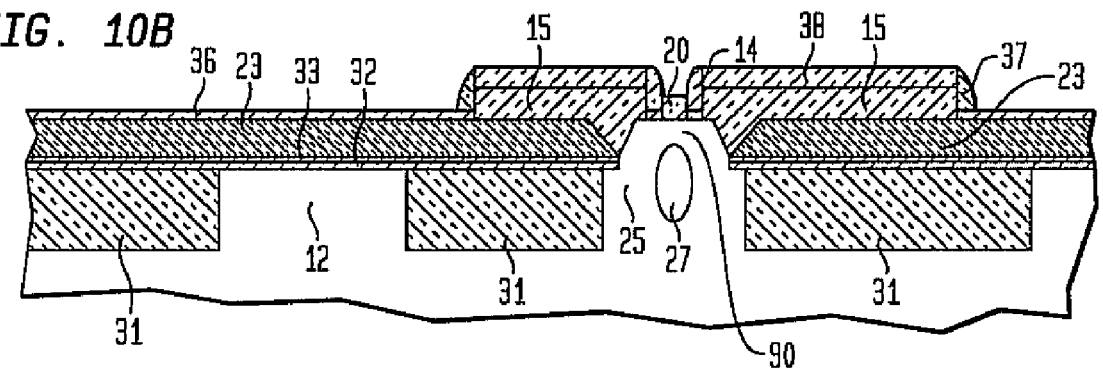

Referring to FIGS. 10(a) and 10(b), in a next process step the emitter plug 40 is recessed to form the recessed emitter 20, where the emitter is recessed below the top surface of the extrinsic base regions 15. The emitter plug may be recessed by conventional etch processes including, but not limited to: dry etch processes and wet etch processes. Preferably, the etch process may be reactive ion etch using an etch chemistry that recesses the polysilicon emitter plug selective to the SiO$_2$ of the extrinsic base isolation dielectric 38 and the SiO$_2$ of the etch stop layer 36. The etch chemistry may comprise KOH. FIG. 10(b) represents this process step when the base window (Bx) has a lesser lateral dimension than the active area (Rx) of the device.

Due to the growth differential between polysilicon grown on epitaxially grown Si-containing materials and polysilicon grown on oxide materials the polysilicon within the emitter channel 34 is thicker than the polysilicon grown atop the isolation regions 31. Therefore, the polysilicon layer 39 atop the isolation regions 31 may be completely removed during the emitter recess etch, while a portion of the emitter plug 40 remains forming the recessed emitter 20. The recessed emitter 20 is self-aligned to the extrinsic base 15, since the recessed emitter 20 is formed within the emitter channel 34, which is formed from the layer that subsequently becomes the extrinsic base regions 15. The emitter/base spacers 14 separate the recessed emitter 20 and extrinsic base 15.

The recessed extrinsic emitter 20 may have a vertical height ranging from about 50 nm to about 500 nm, preferably ranging from about 60 nm to 80 nm. Recessing the emitter 20 reduces the extrinsic portion of the emitter, therefore reducing the current path to the intrinsic portion of the emitter and minimizing the emitter resistance (Re). Recessing the extrinsic emitter 20 also substantially reduces the emitter-base capacitance (Ceb) to a level that allows for a reduced emitter/base spacer 14 width W1 without disadvantageously affecting the device's overall performance. Reducing the emitter/base spacer 14 width W1 positions the extrinsic base 15 in closer proximity to the intrinsic base, therefore reducing the base resistance (Rb).

Figure 11A:
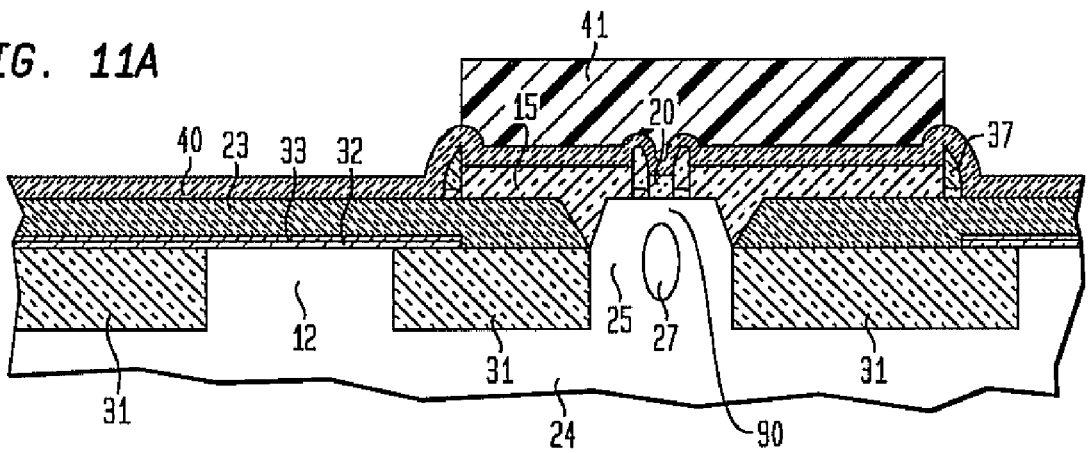
Figure 11B:
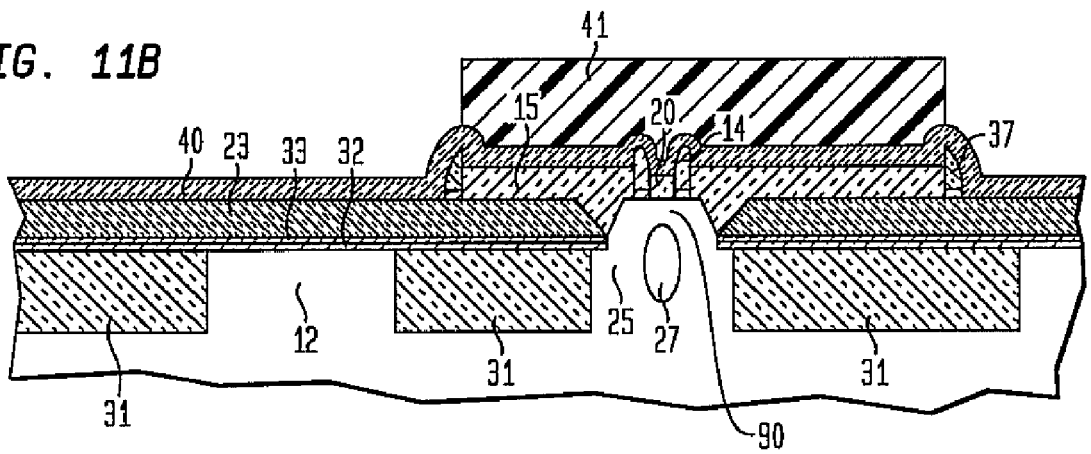

Referring to FIGS. 11(a) and 11(b), in a next process step the emitter base isolation dielectric 38 and the etch stop layer 36 are removed from the top surface of the extrinsic base 15 and the top surface of the epitaxially grown SiGe layer 23 using conventional selective etch methods. Preferably, the TEOS SiO$_2$ emitter base isolation dielectric 38 and SiO$_2$ etch stop layer 36 are etched selective to the Si$_3$N$_4$ of the dielectric spaces 14, 37, and the n-type doped epitaxially grown SiGe layer 23. The etch process may include wet and dry processes, preferably being reactive ion etch.

A hardmask oxide layer 40 is then conformally grown, preferably using tetraethylorthosilicate (TEOS) precursors, atop the surface of the device including the exposed surface of the extrinsic base region 15 and the exposed surfaces of the epitaxially grown SiGe layer 23. Alternatively, the hardmask oxide layer 40 may be formed using conventional low temperature thermal growth or low temperature deposition processes including but not limited to: chemical vapor deposition, and plasma enhanced chemical vapor deposition. The terms "low temperature" are meant to denote a temperature ranging from about 450° C. to about 500° C.

Following polysilicon deposition a photoresist block mask 41 is then formed aligned to the dielectric spacers 37, which are positioned on the outer sidewall of the extrinsic base regions 15. Specifically, the formation of the photoresist block mask 41 begins with the blanket deposition of a layer of photoresist over the entire structure. The photoresist layer is then selectively exposed to light and developed to pattern a block mask 41, protecting at least one first region of the substrate and exposing at least one second region of the substrate. The exposed regions of the device are then processed while the regions underlying the photoresist block mask 41 are protected.

Following the formation of the photoresist block mask 41, the exposed regions of the hardmask oxide layer 40 are etched selective to the dielectric spacers 37 and the underlying epitaxially grown SiGe layer 23. Preferably, the exposed regions of the oxide hardmask layer 40 are etched by reactive ion etch using an etch chemistry selective to the Si$_3$N$_4$ of the dielectric spacers 14 and the photoresist hard mask 41.

In a next process step, the photoresist block mask 41 is removed using a chemical strip, preferably comprising HF. Following photoresist block mask 41 removal, the exposed portions of the epitaxially grown SiGe layer 23 are etched exposing the underlying etch stop layer 32, where a remaining portion of the oxide hardmask layer 40 protects the underlying extrinsic base regions 15. Preferably, the exposed portions of the epitaxially grown SiGe layer 23 may be removed by reactive ion etch using an etch chemistry selective to the underlying SiO$_2$ etch stop layer 32.

Figure 12A:
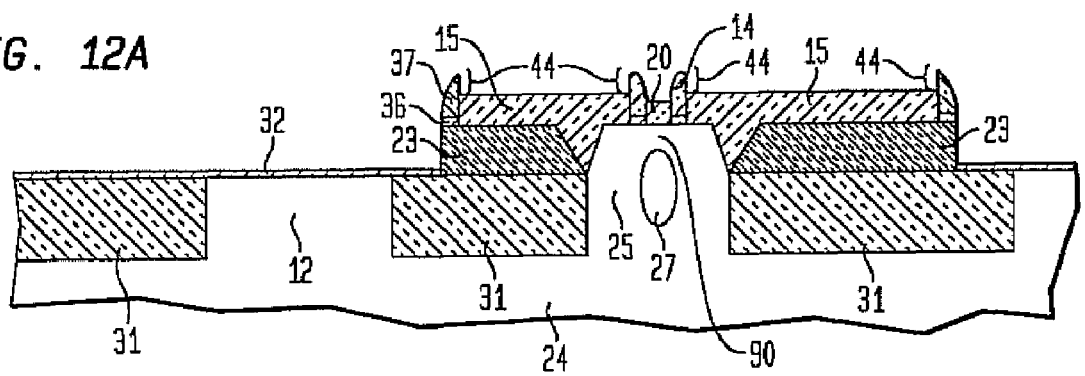
Figure 12B:
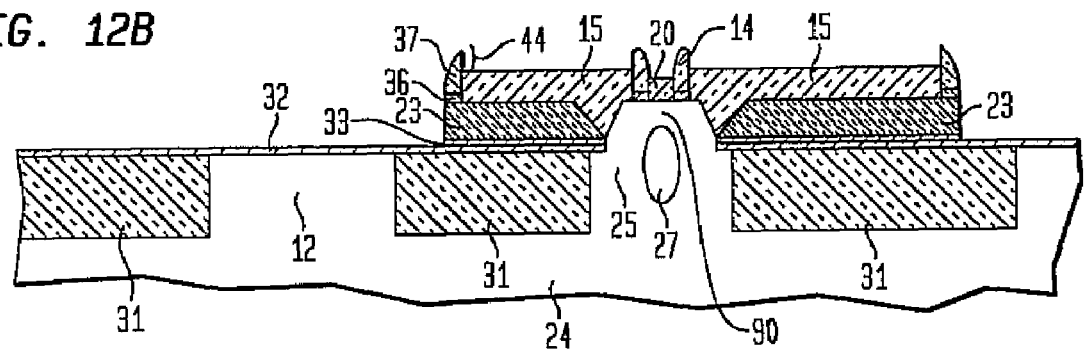

The remaining portions of the oxide hard mask 40 are then removed by conventional selective etch processes to expose the top surface of the extrinsic base 15, where a portion 44 of the dielectric spacers 14, 37 vertically extend beyond the top surface of the extrinsic base 15, as depicted in FIGS. 12(a) and 12(b). Preferably, the TEOS oxide of the oxide hardmask 40 layer is removed selective to the polysilicon seed layer 33. Thereafter, the polysilicon seed layer 33 is etched selective to the SiO$_2$ etch stop layer 32, the SiGe extrinsic base region 15, and the Si$_3$N$_4$ of the dielectric spacers 14, 37.

Figure 13A:
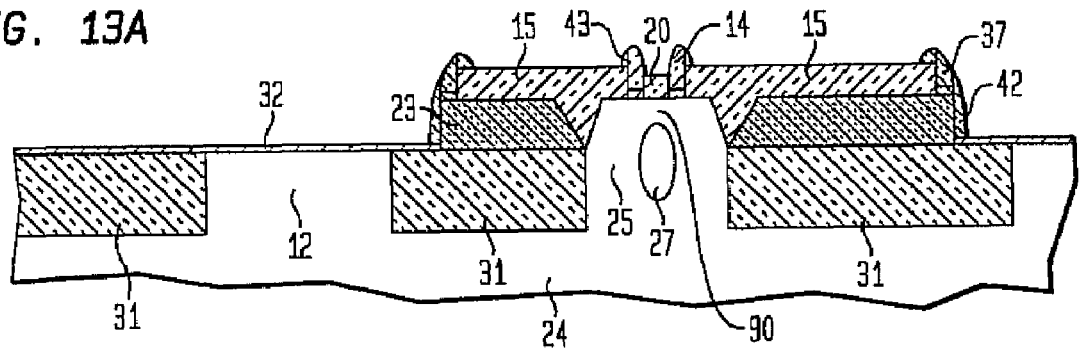
Figure 13B:
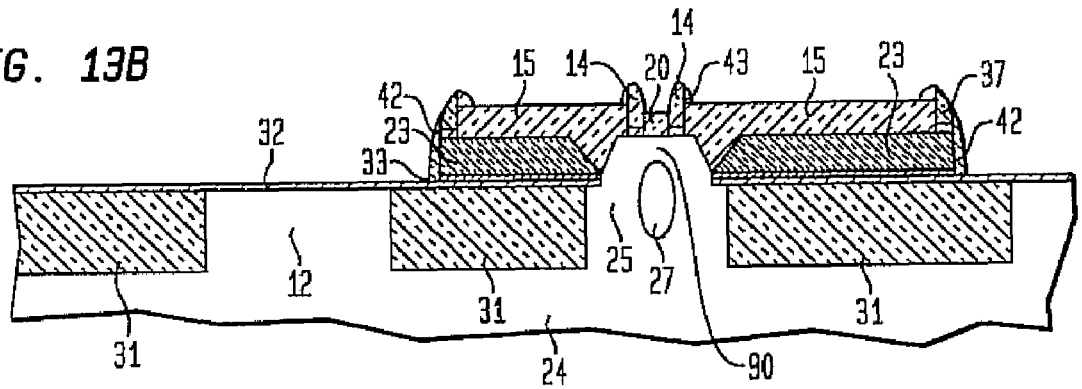

Referring now to FIGS. 13(a) and 13b), insulating spacers 42, 43 are then formed on dielectric spacers 14, 37. Insulating spacers 42, 43 may be employed to ensure that subsequently formed silicide contacts do not short the extrinsic base regions 15 to the emitter 20. Insulating spacers 42, 43 are preferably employed when forming Ni silicide contacts. Insulating spacers 42, 43 may be omitted, for example, when utilizing Co silicide.

Outer insulating spacers 42 are formed abutting the outer sidewall of the outer dielectric spacer 37 and the epitaxially grown SiGe layer 23. Inner insulating spacers 43 are formed abutting the inner sidewall of the dielectric spacer portion 44 that extends beyond the top surface of the extrinsic base region 15. The spacer material may comprise a dielectric such as a nitride, oxide, oxynitride, or a combination thereof, preferably being $Si_3N_4$. The insulating spacers 42, 43 may be formed by conventional deposition and etch processes. The width of the outer insulating spacer 42 may range from about 22.5 nm to about 27.5 nm. The width of the inner insulating spacer 43 may range from about 22.5 nm to about 27.5 mm. An insulating cap is also formed atop the recessed emitter 20, where the insulating cap restricts the outdiffusion of the emitter dopant during emitter dopant drive-in anneal. Preferably, the insulating cap (not shown) atop the emitter 20 is a nitride, such as $Si_3N_4$.

In a next process step, a conventional emitter dopant drive-in anneal is conducted using a rapid thermal anneal process at a temperature on the order of approximately 1000° C. and for a time period on the order of about 10 seconds. During the emitter drive in anneal dopant from the emitter 20 diffuses into an underlying portion of the base material, where the diffused dopant produces the intrinsic emitter. Preferably, n-type dopant diffuses into a portion of the underlying p-type SiGe base material forming an n-type intrinsic emitter. Following emitter drive in anneal the cap layer atop the emitter is removed. Thereafter, the oxide etch stop layer 32 may be selectively etched to expose the reach through portion 12 of the collector on which a silicide layer 28 may be subsequently formed.

Figure 14A:
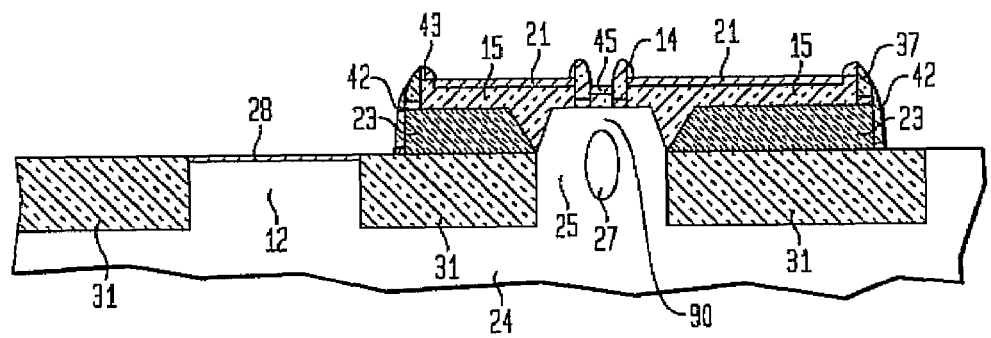
Figure 14B:
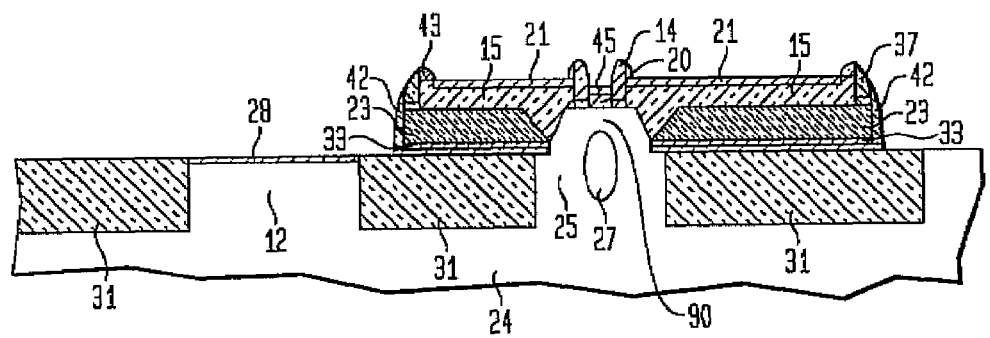

Referring now to FIGS. 14(*a*) and 14(*b*), in a next process step silicide contacts 21, 28, 45 are provided atop the collector reach through 12, extrinsic base regions 15, and recessed emitter 20. Silicide formation typically requires depositing a refractory metal such as Ni, Co, or T1 onto the surface of a Si-containing material. Spacers 14, 37, 42, 43, ensure that the silicide contacts do not short that the collector, emitter, and base regions; since silicide does not form on the insulating spacers separating the collector, emitter, and base regions. Following metal deposition, the structure is then subjected to an annealing step using conventional processes such as, but not limited to, rapid thermal annealing. During thermal annealing, the deposited metal reacts with Si forming a metal silicide.

The formation of silicide contacts to the emitter, base, and collector reduces the parasitic portions of the emitter resistance (Re), base resistance (Rb), and collector resistance (Rc). In comparison to the prior transistor structure, similar to the one depicted in FIG. 1, the present invention further decreases the base resistance (Rb) by siliciding substantially the entire upper surface of the extrinsic base region 15.

Figure 15A:
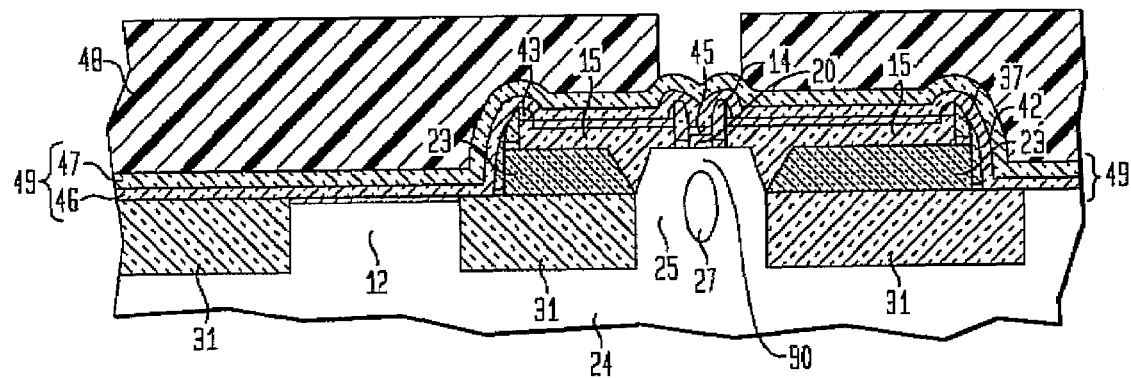
Figure 15B:
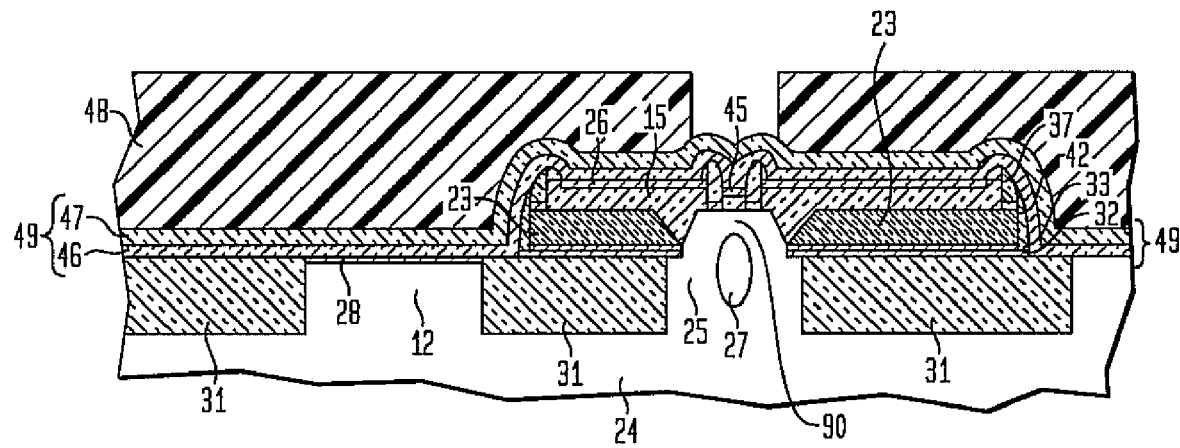

Referring now to FIGS. 15(*a*) and 15(*b*), an isolation stack 49 of insulative materials, such as oxides, nitrides, and oxynitrides, is then deposited atop the top surface of the structure depicted in FIG. 14(*a*). Preferably, the isolation stack 49 comprises an isolation nitride layer 47 formed atop an isolation oxide layer 46. The isolation oxide layer 46 may comprise $SiO_2$ formed by plasma enhanced chemical vapor deposition (PECVD) from tetraethylorthosilicate (TEOS) precursors. Alternatively, the isolation oxide layer 46 may be formed using low temperature deposition and thermal growth processes. The thickness of the isolation oxide layer 46 may range from approximately 40 nm to approximately 60 nm.

Isolation nitride layer 47 may be deposited atop the isolation oxide layer 46 using conventional deposition processes including but not limited to: chemical vapor deposition (CVD) and plasma-enhanced chemical vapor deposition (PECVD). The thickness of the isolation nitride layer 47 may range from approximately 80 nm to approximately 120 nm.

A layer of photoresist 48 is then applied via spin-coating or similar processes atop the isolation stack 49. The layer of photoresist 48 is then patterned and developed to expose a portion of the isolation stack 49 overlying the intrinsic portion 90 of the device.

Figure 16A:
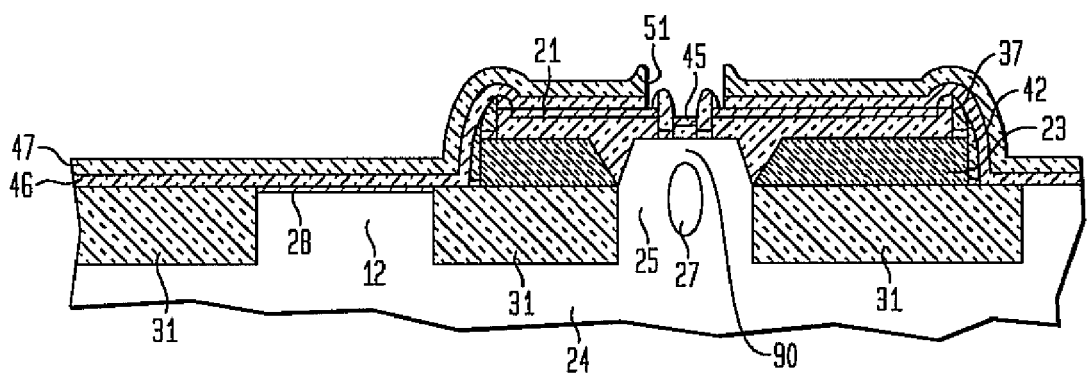
Figure 16B:
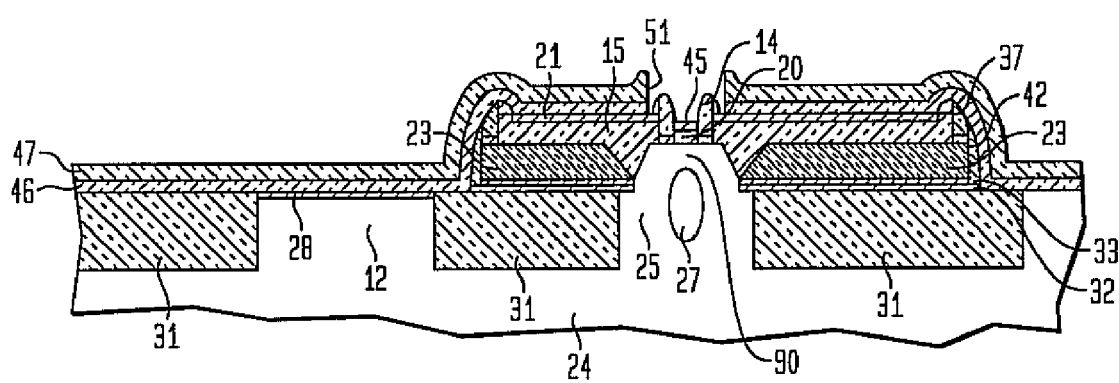

Referring to FIGS. 16(*a*) and (*b*), the exposed portions of the isolation stack 49 are then removed using a selective etch process, preferably being reactive ion etch, where the portion of the isolation stack 49 underlying the remaining photoresist 48 is protected. Preferably, the exposed isolation polysilicon layer 47 is removed by an etch chemistry selective to the patterned photoresist 48 and the underlying $SiO_2$ isolation oxide layer 46. Thereafter, the $SiO_2$ isolation oxide layer 46 is preferably removed using an etch chemistry selective to the patterned photoresist 48, $Si_3N_4$ spacers 14, 42, and polysilicon recessed extrinsic emitter 20. Recesses 51 may be formed between the etched isolation stack and the spacers 14, 42 on either side of the recessed emitter 20. The patterned photoresist 48 is then removed using a wet chemical strip.

Referring now to FIGS. 17(*a*) and 17(*b*), contact isolation spacers 60 are then formed to fill the recesses 51 and ensure that the subsequently formed emitter interconnect 63 does not short the recessed emitter 20 to the extrinsic base regions 15. A layer of insulating material, preferably being $Si_3N_4$, is first deposited atop the top surface of the structure, depicted in FIG. 16(*a*) and FIG. 16(*b*), including the recesses 51. The layer of insulating material is then etched using conventional photolithography and etch processes to provide contact isolation spacers 60 that fill the recesses 15, while ensuring that the narrowest emitter contact region is produced. The contact isolation spacers 60 also electrically isolate the top surface of extrinsic base 15 from the subsequently formed emitter interconnect 63. The width W4 of the recessed emitter 20 contact surface may range from about 60 nm to about 200 mm, preferably being 100 nm.

Figure 18B:
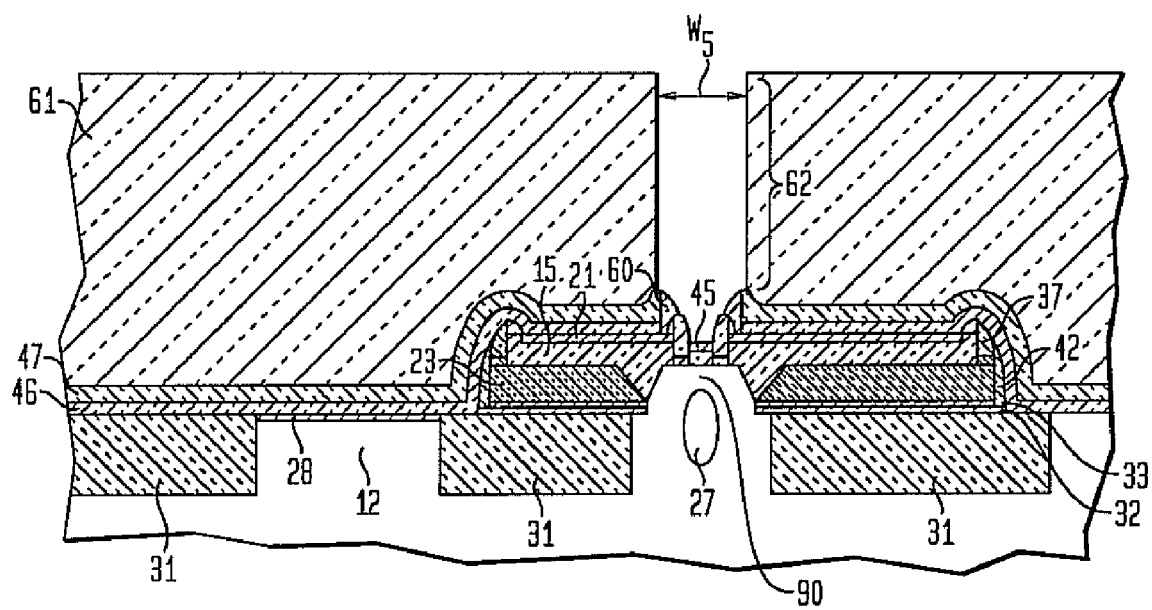
Figure 19A:
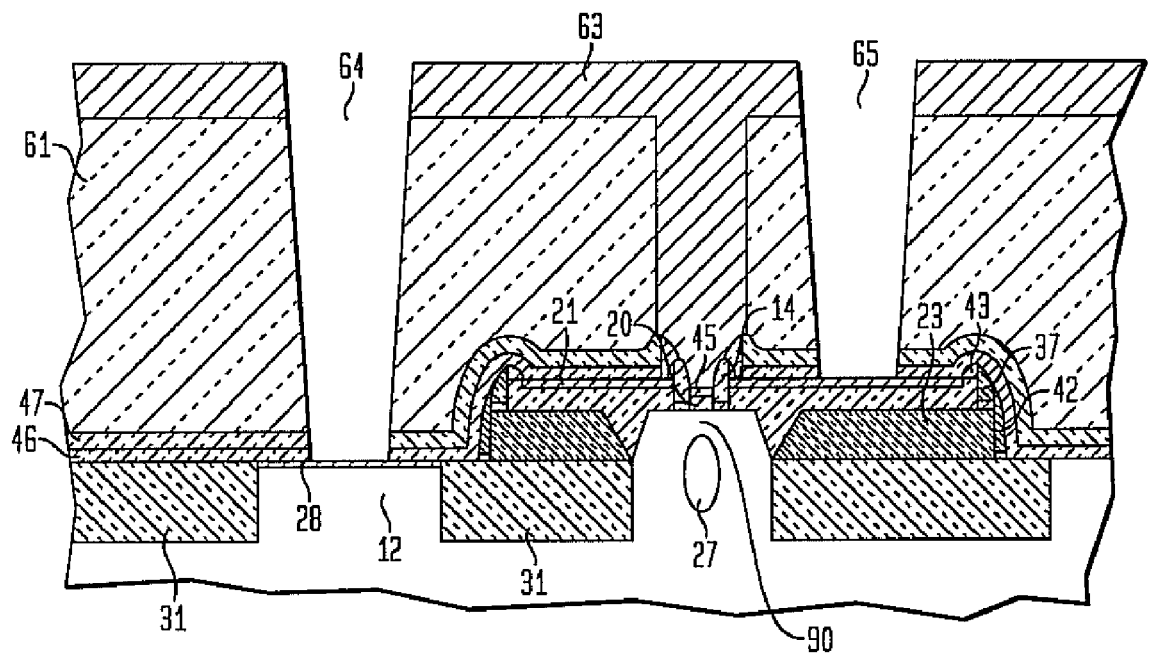
Figure 19B:
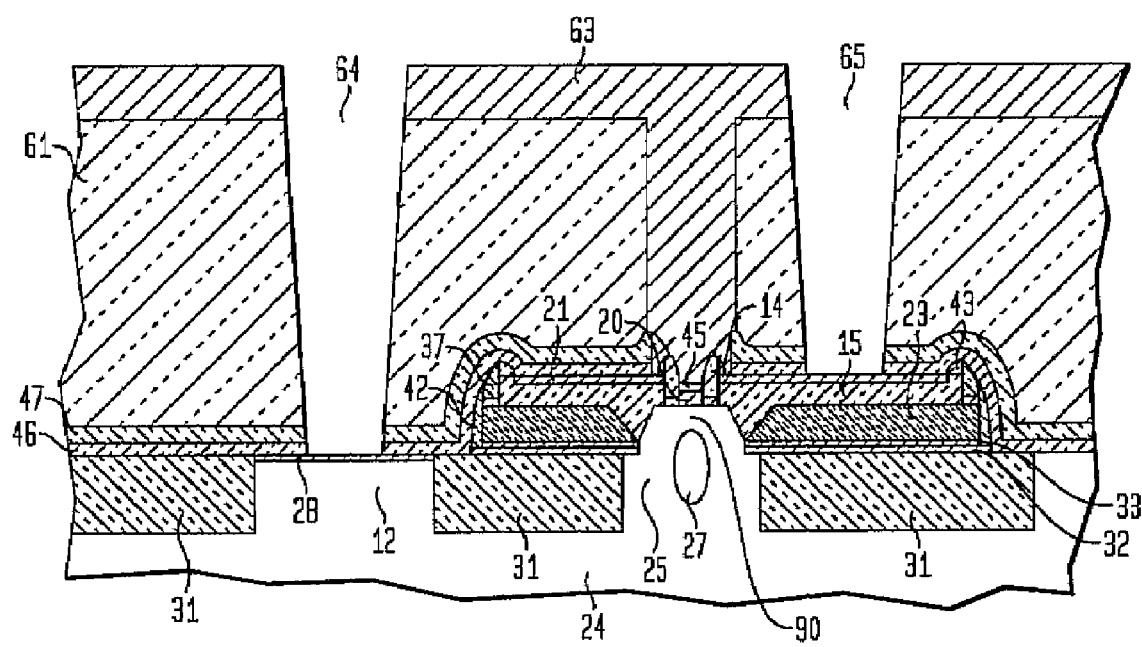

Referring to FIGS. 18(*a*) and (*b*), following contact isolation spacer 60 formation, a layer of dielectric material is blanket deposited atop the entire substrate and planarized. A blanket dielectric layer 61 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC), also known as amorphous hydrogenated carbon. Additional choices for the blanket dielectric 61 include: any of the aforementioned materials in porous form, or in a form that changes during processing to or from being porous and/or permeable to being non-porous and/or non-permeable.

The blanket dielectric layer 61 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation. In a preferred embodiment, the dielectric layer 61 comprises spin-on-glass, most preferably being boron phosphorus silicate glass (BPSG).

Still referring to FIGS. 18(*a*) and 18(*b*), the deposited dielectric 61 is then patterned and etched to form an emitter contact via 62 to the recessed emitter 20. The width W5 of the emitter contact via 62 may be greater than the width W4 of the recessed emitter 20 contact surface since the isolation stack 49 and the contact isolation spacers 60 electrically isolate the extrinsic base regions 15 from the emitter interconnect 63, which is subsequently formed within the emitter contact via 62.

Following emitter contact via 62 formation, the emitter interconnect 63 is formed by depositing a conductive metal into the emitter contact via 62 using conventional processing, such as CVD or plating. The conductive metal may include, but is not limited to: tungsten, copper, aluminum, silver, gold, and alloys thereof. In a next process step, collector region interconnects 64 to the collector contact silicide 28 and base region interconnects 65 to the extrinsic base silicide 21 are formed using conventional process steps, as depicted in FIGS. 19(*a*) and 19(*b*).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A bipolar transistor comprising:
    an emitter;
    a base comprising an intrinsic base portion in electrical contact with said emitter and an extrinsic base portion in electrical contact with said intrinsic base portion and electrically isolated from said emitter;
    a collector comprising an intrinsic collector portion surrounded by an extrinsic collector, said intrinsic collector portion in electrical contact with said intrinsic base portion, wherein an active area of said bipolar transistor includes at least said intrinsic collector portion and said intrinsic base portion; and
    a base window dielectric positioned between said extrinsic collector and said extrinsic base portion, wherein said base window dielectric extends into said active area of said bipolar transistor.

2. The bipolar transistor of claim 1 wherein said emitter is recessed beneath an upper surface of said extrinsic base portion.

3. The bipolar transistor of claim 1 wherein silicide regions cover substantially entire surface of said extrinsic base portion.

4. The bipolar transistor of claim 1 wherein said collector further comprises a narrow pedestal implant region, wherein said narrow pedestal implant region has a peak dopant concentration abutting said extrinsic collector.

\* \* \* \* \*